United States Patent
Kim et al.

(10) Patent No.: US 10,141,373 B2
(45) Date of Patent: Nov. 27, 2018

(54) MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Song-Yi Kim, Yongin-si (KR); Jae-Kyu Lee, Seongnam-si (KR); Dae-Hwan Kang, Seoul (KR); Gwan-Hyeob Koh, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 20 days.

(21) Appl. No.: 15/387,751

(22) Filed: Dec. 22, 2016

(65) Prior Publication Data
US 2017/0278895 A1    Sep. 28, 2017

(30) Foreign Application Priority Data
Mar. 22, 2016 (KR) .................. 10-2016-0033832

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1233* (2013.01); *H01L 45/1246* (2013.01); *H01L 45/1253* (2013.01); *H01L 45/144* (2013.01)

(58) Field of Classification Search
CPC . H01L 27/2481; H01L 45/06; H01L 45/1233; H01L 45/1246; H01L 45/1253; H01L 45/144
See application file for complete search history.

(56) References Cited

U.S. PATENT DOCUMENTS

| | | | |
|---|---|---|---|
| 7,838,341 B2 | 11/2010 | Dennison | |
| 8,188,454 B2 | 5/2012 | Dennison | |
| 8,664,631 B2 | 3/2014 | Hirota et al. | |
| 9,070,620 B2 | 6/2015 | Zhang | |
| 9,130,153 B2 | 9/2015 | Kim et al. | |
| 9,136,307 B2 * | 9/2015 | Pellizzer | H01L 45/06 |
| 9,576,657 B1 * | 2/2017 | Saenz | |
| 2004/0147081 A1 * | 7/2004 | Hsu | G11C 13/0007 438/296 |
| 2014/0301127 A1 * | 10/2014 | Kim | G11C 13/0004 365/148 |
| 2015/0102451 A1 | 4/2015 | Zhang | |
| 2015/0318470 A1 | 11/2015 | Bresolin et al. | |

FOREIGN PATENT DOCUMENTS

| | | |
|---|---|---|
| KR | 10-1046243 | 7/2011 |
| KR | 10-1096445 | 12/2011 |

* cited by examiner

*Primary Examiner* — Mark Tornow
(74) *Attorney, Agent, or Firm* — F. Chau & Associates, LLC

(57) ABSTRACT

A plurality of first conductive patterns is disposed on a substrate. Each of the plurality of first conductive patterns extends in a first direction. A first selection pattern is disposed on each of the plurality of first conductive patterns. A first barrier portion surrounds the first selection pattern. A first electrode and a first variable resistance pattern are disposed on the first selection pattern. A plurality of second conductive patterns is disposed on the first variable resistance pattern. Each of the plurality of second conductive patterns extends in a second direction crossing the first direction.

12 Claims, 46 Drawing Sheets

MEMORY DEVICE AND METHOD OF MANUFACTURING THE SAME

CROSS-REFERENCE TO RELATED APPLICATION

This application claims priority under 35 USC § 119 to Korean Patent Application No. 10-2016-0033832, filed on Mar. 22, 2016 in the Korean Intellectual Property Office (KIPO), the disclosure of which is incorporated by reference herein in its entirety.

TECHNICAL FIELD

The present inventive concept relates to a memory device and a method of manufacturing the same.

DISCUSSION OF RELATED ART

As memory devices are highly integrated, variable resistance memory devices having vertically stacked cross-point array structures have been manufactured.

SUMMARY

According to an exemplary embodiment of the present inventive concept, a memory device is provided as follows. A plurality of first conductive patterns is disposed on a substrate. Each of the plurality of first conductive patterns extends in a first direction. A first selection pattern is disposed on each of the plurality of first conductive patterns. A first barrier portion surrounds the first selection pattern. A first electrode and a first variable resistance pattern are disposed on the first selection pattern. A plurality of second conductive patterns is disposed on the first variable resistance pattern. Each of the plurality of second conductive patterns extends in a second direction crossing the first direction, According to an exemplary embodiment of the present inventive concept, a memory device is provided as follows. A plurality of first conductive patterns is disposed on a substrate. Each of the plurality of first conductive patterns extends in a first direction. A first cell structure is disposed on the first conductive pattern. The first cell structure includes a first selection pattern, a first electrode and a first variable resistance pattern sequentially stacked. A first barrier portion surrounds the first selection pattern. A plurality of second conductive patterns is disposed on the first cell structure. Each of the plurality of second conductive patterns extends in a second direction crossing the first direction. A second cell structure is disposed on the second conductive pattern. The second cell structure includes a second selection pattern, a second electrode and a second variable resistance pattern sequentially stacked. A second barrier portion surrounds the second selection pattern. A plurality of third conductive patterns is disposed on the second cell structure. Each of the plurality of third conductive patterns extends in the first direction.

According to an exemplary embodiment of the present inventive concept, a method of manufacturing a memory device is provided as follows. A plurality of first conductive patterns is formed on a substrate, each of the plurality of first conductive patterns extending in a first direction. A first selection pattern is formed on each of the plurality of first conductive patterns. A first barrier portion is formed to surround the first selection pattern. A first electrode and a first variable resistance pattern are formed on the first selection pattern. A plurality of second conductive patterns is formed on the first selection pattern, each of the plurality of second conductive patterns extending in a second direction crossing the first direction.

According to an exemplary embodiment of the present inventive concept, a method of manufacturing a memory device is provided as follows. A plurality of first conductive patterns is on a substrate, each of the plurality of first conductive patterns extending in a first direction. An insulation layer is formed to cover the plurality of first conductive patterns. A portion of the insulation layer is etched to form an insulation pattern including an opening. A first barrier portion is formed on a sidewall of the opening. A first selection pattern is formed to fill the opening. A first electrode and a first variable resistance pattern are formed on the first selection pattern. A plurality of second conductive patterns is formed on the first selection pattern, each of the plurality of second conductive patterns extending in a second direction crossing the first direction.

According to an exemplary embodiment of the present inventive concept, a memory device is provided as follows. A first conductive pattern having a first width is disposed on a substrate. The first conductive pattern extends in a first direction. A first selection pattern having a second width is formed on the first conductive pattern. The second width is smaller than the first width. A first barrier portion surrounds the first selection pattern. A first electrode is disposed on the first selection pattern and the first barrier portion. A first variable resistance pattern is disposed on the first electrode. A second conductive pattern is disposed on the first variable resistance pattern. The second conductive pattern extends in a second direction crossing the first direction.

BRIEF DESCRIPTION OF DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
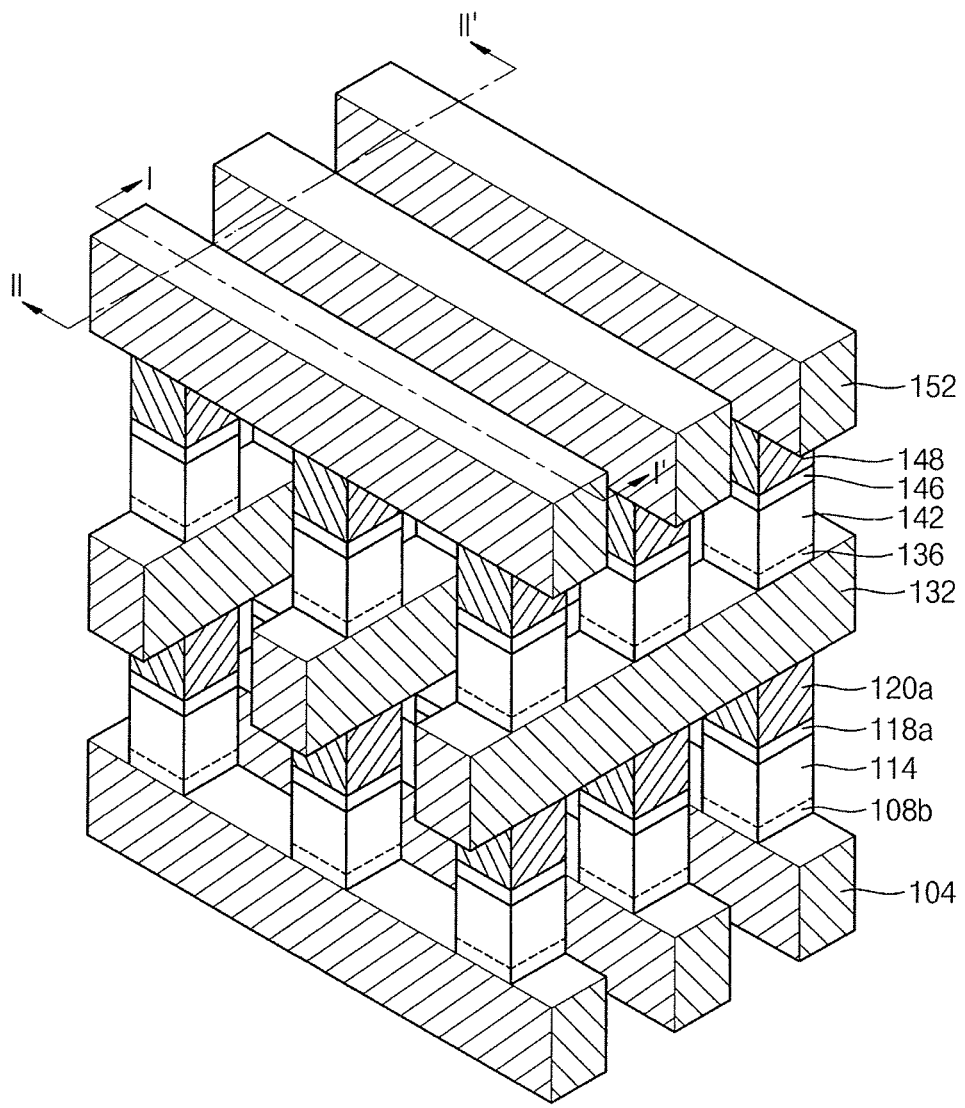
FIGS. 1 and 2 are a perspective view and a cross-sectional view, respectively, illustrating a memory device in accordance with example embodiments.
Figure 1:
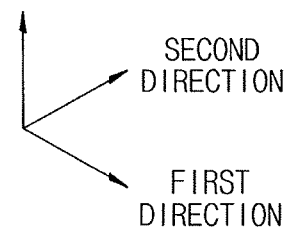

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
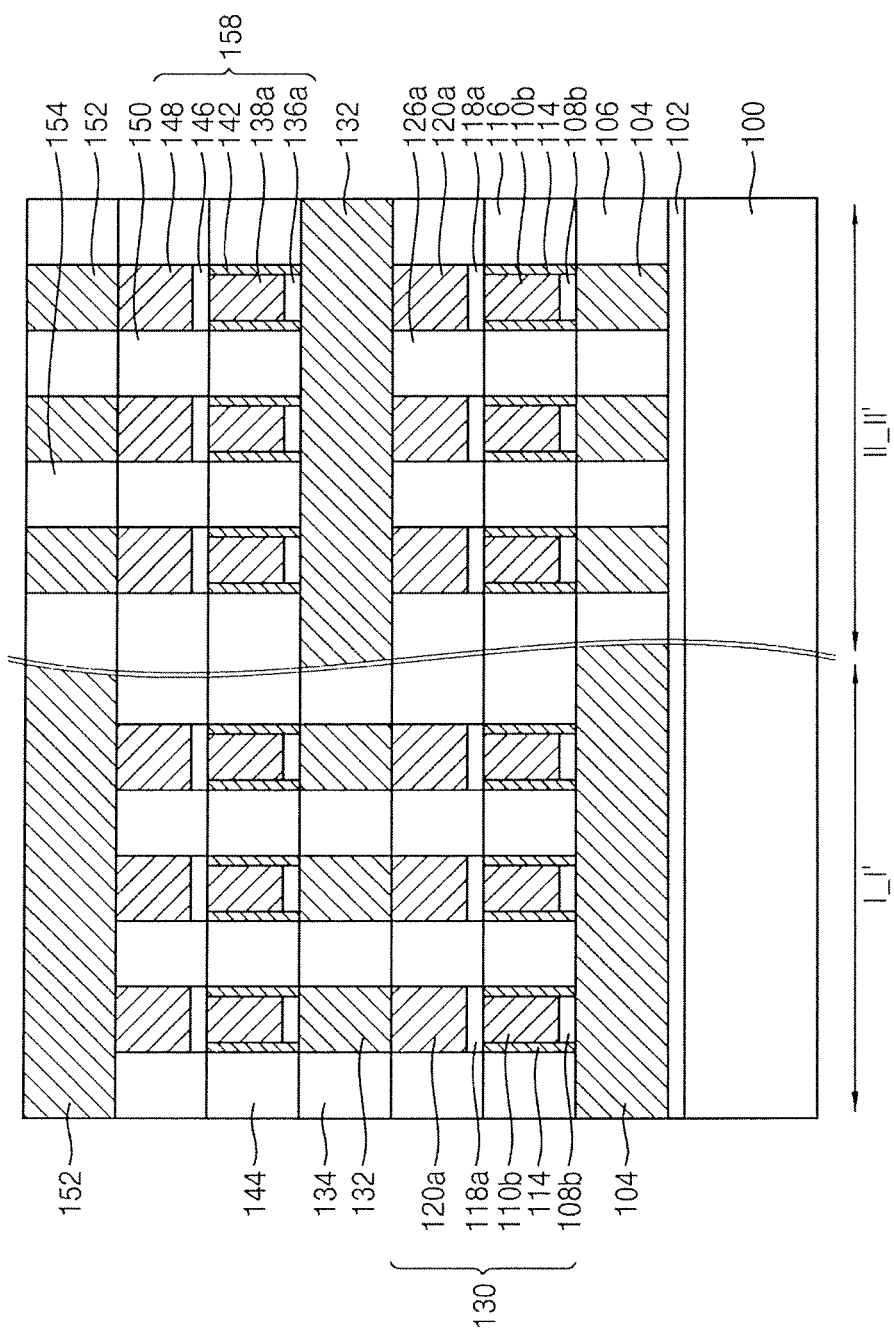
Figure 3:
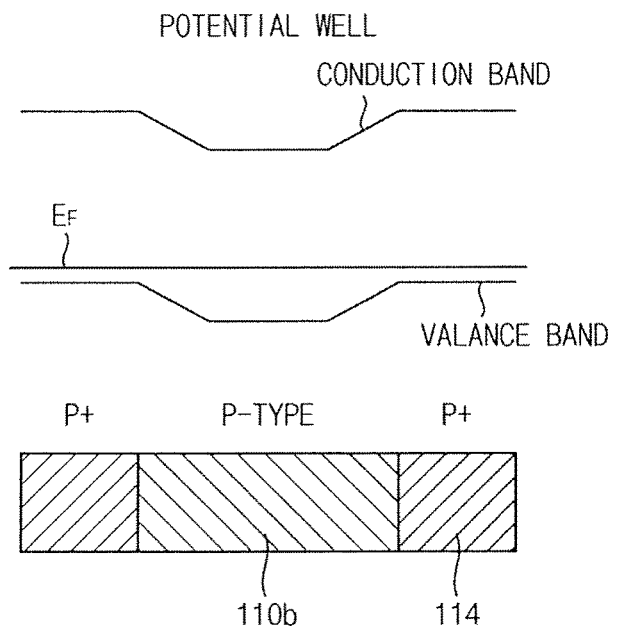
FIGS. 3 and 4 show an energy band diagram having energy levels of a selection pattern and a barrier portion according to a doping concentration therein.
Figure 4:
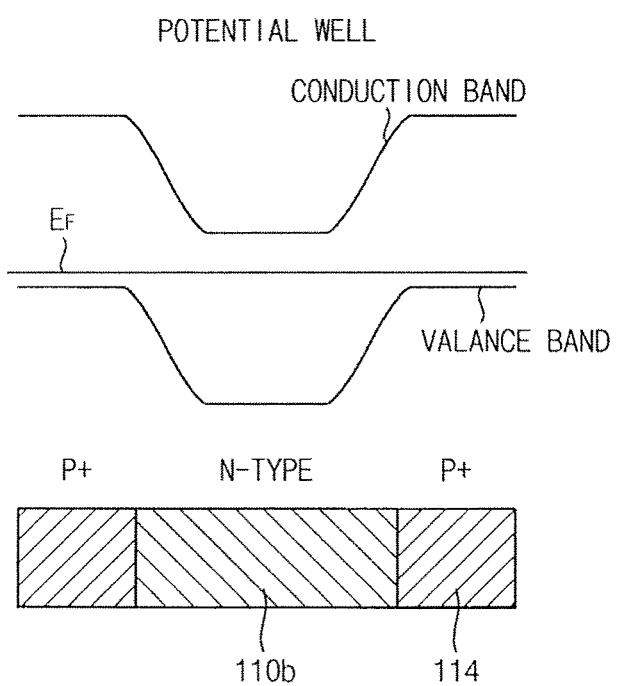

FIGS. 1 and 2 are a perspective view and a cross-sectional view, respectively, illustrating a memory device in accordance with example embodiments. FIGS. 3 and 4 show an energy band diagram having energy levels of a selection pattern and a barrier portion according to doping concentrations therein.

FIG. 2 includes cross-sectional views taken along lines I-I' and II-II' of FIG. 1, respectively. The memory device may be a variable resistance memory device.

A first direction and a second direction may be substantially parallel to a top surface of a substrate, and may be substantially perpendicular to each other. A third direction may be substantially perpendicular to the top surface of the substrate. Hereinafter, the definitions of the first to third directions may be the same in all figures.

Referring to FIGS. 1 to 3, the memory device may be formed on a substrate 100. The memory device may include a first conductive pattern 104, a first cell structure 130, a second conductive pattern 132, a second cell structure 158 and a third conductive pattern 152. The first cell structure 130 may include a first selection pattern 110b, a first barrier portion 114, a first electrode 118a, a first lower electrode 108b and a first variable resistance pattern 120a. The second cell structure 158 may include a second selection pattern 138a, a second barrier portion 142, a second electrode 146 and a second variable resistance pattern 148.

The substrate 100 may include silicon, germanium, silicon-germanium, or III-V compounds, e.g., GaP, GaAs, GaSb, etc. In some example embodiments, the substrate 100 may be a silicon-on-insulator (SOI) substrate, or a germanium-on-insulator (GOI) substrate. In some example embodiments, at least an upper portion of the substrate 100 may be an insulation layer.

In example embodiments, lower elements including, e.g., transistors and an insulation layer 102 covering the lower elements may be formed on the substrate 100. The insulation layer 102 may include silicon oxide.

In example embodiments, the lower elements may form peripheral circuits. For example, the memory device may have a cell-over-peripheral (COP) structure, which may include peripheral circuits and memory cells sequentially stacked.

The first conductive pattern 104 may extend in the first direction, and a plurality of first conductive patterns 104 may be arranged in the second direction. In example embodiments, the first conductive pattern 104 may be formed on the insulation layer 102.

The first conductive pattern 104 may include a metal or a metal nitride. In example embodiments, the first conductive pattern 104 may include a first barrier pattern, a first metal pattern and a second barrier pattern sequentially stacked. The first and second barrier patterns may include a metal nitride, e.g., titanium nitride (TiNx), tungsten nitride (WNx), tantalum nitride (TaNx), zirconium nitride (ZrNx), etc., or a metal silicon nitride, e.g., titanium silicon nitride (TiSiNx), tungsten silicon nitride (WSiNx), tantalum silicon nitride (TaSiNx), zirconium silicon nitride (ZrSiNx), etc. The first metal pattern may include a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc.

In example embodiments, the first conductive pattern 104 may serve as a first word line of the variable resistance memory device. In example embodiments, the first conductive pattern 104 may serve as a first bit line of the variable resistance memory device.

In example embodiments, the first cell structure 130 may have a pillar shape. The first cell structure 130 may be formed on each of the first conductive patterns 104, and a plurality of first cell structures 130 may be spaced apart from each other on each of the first conductive patterns 104. The first cell structures 130 may be aligned with each other in each of the first and second directions.

In example embodiments, in the first cell structure 130, the first selection pattern 110b, the first electrode 118a and the first variable resistance pattern 120a may be sequentially stacked, and the first barrier portion 114 may surround a sidewall of the first selection pattern 110b.

In example embodiments, a first lower electrode 108b may be further formed between the first selection pattern 110b and the first conductive pattern 104, and a first upper electrode (not shown) may be further formed on the first variable resistance pattern 120a. In example embodiments, the first electrode 118a may serve as a heating electrode. In this case, each of the first lower electrode 108b and the first upper electrode may serve as a glue layer for attaching the first cell structure 130 to underlying and overlying structures. For example, the first lower electrode 108b may attach the first cell structure 130 to the first conductive pattern 104; and the first upper electrode may attach the first cell structure 130 to the second conductive pattern 132. In example embodiments, the first upper electrode may serve as a heating electrode. In this case, the first lower electrode 108b and the first electrode 118a may serve as the glue layer.

In example embodiments, the first electrode 118a, the first upper electrode and the first lower electrode 108b may include a metal nitride, e.g., titanium nitride (TiNx), tungsten nitride (WNx), tantalum nitride (TaNx), zirconium nitride (ZrNx), etc., or a metal silicon nitride, e.g., titanium silicon nitride (TiSiNx), tungsten silicon nitride (WSiNx), tantalum silicon nitride (TaSiNx), zirconium silicon nitride (ZrSiNx), etc.

In example embodiments, the first selection pattern 110b may include an Ovonic threshold switch (OTS) material. The OTS material may be a variable resistor according to the temperature at an amorphous state. For example, the first selection pattern 110b may maintain the amorphous state in a wider range of the temperature, when compared to the first variable resistance pattern 120a. In the amorphous state, a resistance of the OTS material may be greatly varied according to the temperature. Thus, the first selection pattern 110b including the OTS material may serve as a switching element for selection of cells.

The OTS material may include germanium (Ge), silicon (Si), arsenic (As) and/or tellurium (Te). Also, the OTS material may further include selenium (Se) and/or sulfur (S).

The OTS material may include, e.g., AsTeGeSiIn, GeTe, SnTe, GeSe, SnSe, AsTeGeSiSbS, AsTeGeSiIP, AsTeGeSi, As2Te3Ge, As2Se3Ge, As25(Te90Ge10)75, Te40As35Si18Ge6.75In0.25, Te28As34.5Ge15.5S22, Te39As36Si17Ge7P, As10Te21S2Ge15Se50Sb2, Si5Te34As28Ge11S21Se1, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, GexSe1-x, etc.

In example embodiments, a conductivity type of the first selection pattern 110b may be a p type or a p− type. Hereinafter, a "p type" or "p doped" may refer to a first doping concentration of p type impurities; "p− type" or "p− doped" may refer to a second doping concentration of the p type impurities less than the first doping concentration; a "p+ type" or "p+ doped" may refer to a third doping concentration of p type impurities greater than the first doping concentration; and a "p++ type" or "p++ doped" may refer to a fourth doping concentration of p type impurities greater than the third doping concentration. In example embodiments, the conductivity type of the first selection pattern 110b may be an n type.

The first barrier portion 114 may be adjacent a sidewall of the first selection pattern 110b. The first barrier portion 114 and the first selection pattern 110b may have a difference of energy levels from each other. In example embodiments, the first barrier portion 114 may be a p type doped region.

When the conductivity type of the first selection pattern 110b is a p type or a p− type, the first barrier portion 114 may have a doping concentration greater than a doping concentration of the first selection pattern 110b. For example, the first barrier portion 114 may be a p+ doped region or p++ doped region. When the conductivity type of the first selection pattern 110b is an n type, the first barrier portion 114 may be a p type doped region of which a doping concentration need not be limited.

The first conductive pattern 104 may have a first width. The first selection pattern 110b may have a second width smaller than the first width. In example embodiments, the first electrode 118a may have a third width which is substantially equal to the first width. In example embodiments, the first variable resistance pattern 120a may have a fourth width which is substantially equal to the first width. In example embodiments, a combined structure of the first barrier portion 114 and the first selection pattern 110b may have a width substantially equal to the first width.

In example embodiments, the first barrier portion 114 may be in contact with a bottom surface of the first electrode 118a and a top surface of the first conductive pattern 104. In this case, the first barrier portion 114 is interposed between the first electrode 118a and the first conductive pattern 104.

In FIG. 3, the conductivity type of the first selection pattern 110b is a p type or a p− type, and the first barrier portion 114 is a p+ doped region or p++ doped region.

In this case, a first difference between an energy of a Fermi level $E_F$ and an energy of a valance band at a central portion of the first selection pattern 110b may be greater than a second difference between an energy of the Fermi level $E_F$ and an energy of a valance band at the first barrier portion 114. Thus, a potential well may be formed at the central portion of the first selection pattern 110b due to the first barrier portion 114.

In FIG. 4, the conductivity type of the first selection pattern 110b is an n type, and the first barrier portion 114 is a p+ doped region or p++ doped region.

In this case, a first difference between the energy of the fermi level and the energy of the valance band at the central portion of the first selection pattern 110b is greater than a second difference between the energy of the fermi level and the energy of the valance band at the first barrier portion 114. Thus, a potential well may be formed at the central portion of the first selection pattern 110b due to the first barrier portion 114.

For example, regardless the conductivity type of the first selection pattern 110b, the potential well may be formed at the central portion of the first selection pattern 110b due to the first barrier portion 114.

Thus, currents may flow at the central portion of the first selection pattern 110b, so that a main current path may be formed at the central portion of the first selection pattern 110b. Also, the currents may hardly flow at the sidewall of the first selection pattern 110b, so that leakage currents from the sidewall of the first selection pattern 110b may decrease.

The first variable resistance pattern 120a may be formed on the first electrode 118a.

In example embodiments, the first variable resistance pattern 120a may include a material of which a resistance may be changed by a phase change or a phase transition. In this case, the variable resistance memory device may be a phase-change random access memory (PRAM) device. The first variable resistance pattern 120a may include a chalcogenide-based material in which germanium (Ge), antimony (Sb) and/or tellurium (Te) are combined by a given ratio.

In some example embodiments, the first variable resistance pattern 120a may include a material of which a resistance may be changed by a magnetic field or a spin transfer torque (STT). In this case, the variable resistance memory device may be a magnetic random access memory (MRAM) device. The first variable resistance pattern 120a may include a ferromagnetic material, e.g., iron (Fe), nickel (Ni), cobalt (Co), dysprosium (Dy), gadolinium (Gd), etc.

In some example embodiments, the first variable resistance pattern 120a may include, e.g., a transition metal oxide or a perovskite-based material.

The second conductive pattern 132 may extend in the second direction.

When the first conductive pattern 104 serves as the first word line, the second conductive pattern 132 may serve as a common first bit line that may be commonly used in the memory device. In example embodiments, when the first conductive pattern 104 serves as the first bit line, the second conductive pattern 132 may serve as a common first word line which may be commonly used in the memory device.

The second conductive pattern 132 may include a metal having a resistance lower than a resistance of the first electrode 118a. The second conductive pattern 132 may include a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc.

As described above, the first and second conductive patterns 104 and 132 may cross each other, and the first cell structure 130 may be formed at each cross-point of the first and second conductive patterns 104 and 132.

Insulation patterns may fill a space between the first conductive patterns 104, a space between the first cell structures 130, and a space between the second conductive patterns 132.

In example embodiments, a first insulation pattern 106 may be formed between the first conductive patterns 104, and a second insulation pattern 116 may be formed between the first selection patterns 110*b*. A third insulation pattern 126*a* may be formed between the first variable resistance patterns 120*a*, and a fourth insulation pattern 134 may be formed between the second conductive patterns 132.

In example embodiments, the first to fourth insulation patterns 106, 116, 126*a* and 134 may include substantially the same material so as not to be distinguished from each other. In example embodiments, at least one of the first to fourth insulation patterns 106, 116, 126*a* and 134 may include a material different from that of the others.

In example embodiments, the first to fourth insulation patterns 106, 116, 126*a* and 134 may include silicon nitride. In example embodiments, the first to fourth insulation patterns 106, 116, 126*a* and 134 may include silicon oxide.

The second cell structure 158 may have a pillar shape. The second cell structure 158 may be formed on each of the second conductive patterns 132, and a plurality of second cell structures 158 may be spaced apart from each other on each of the second conductive patterns 132. The second cell structures 158 may be aligned with each other in each of the first and second directions.

In example embodiments, the second cell structure 158 may be substantially the same as the first cell structure 130. For example, in the second cell structure 158, the second selection pattern 138*a*, the second electrode 146, and the second variable resistance pattern 148 may be sequentially stacked, and the second barrier portion 142 may surround a sidewall of the second selection pattern 138*a*.

In example embodiments, a second lower electrode 136*a* may be further formed between the second selection pattern 138*a* and the second conductive pattern 132, and a second upper electrode (not shown) may be further formed on the second variable resistance pattern 148.

In example embodiments, the second barrier portion 142 may be adjacent to the sidewall of the second selection pattern 138*a*, and may be a p type doped region. A potential well may be formed at a central portion of the second selection pattern 138*a* due to the second barrier portion 142. Thus, currents may hardly flow at the sidewall of the second selection pattern 138*a*, so that leakage currents from the sidewall of the second selection pattern 138*a* may decrease.

The third conductive pattern 152 may extend in the first direction. The third conductive pattern 152 may overlap the first conductive pattern 104.

In example embodiments, the first and third conductive patterns 104 and 152 may serve as a first word line and a second word line, respectively. In example embodiments, the first and third conductive patterns 104 and 152 may serve as a first bit line and a second bit line, respectively.

In example embodiments, the third conductive pattern 152 may be substantially the same as the first conductive pattern 104. For example, the third conductive pattern 152 may include a third barrier pattern, a second metal pattern and a fourth barrier pattern sequentially stacked.

Insulation patterns may fill a space between the second cell structures 158 and a space between the third conductive patterns 152.

In example embodiments, a fifth insulation pattern 144 may be formed between the second selection patterns 138*a*, a sixth insulation pattern 150 may be formed between the second variable resistance patterns, and a seventh insulation pattern 154 may be formed between the third conductive patterns 152.

In example embodiments, the fifth to seventh insulation patterns 144, 150 and 154 may include substantially the same material. In this case, the fifth to seventh insulation patterns 144, 150 and 154 need not be distinguished from each other. In example embodiments, at least one of the fifth to seventh insulation patterns 144, 150 and 154 may include a material different from that of the others.

In example embodiments, the fifth to seventh insulation patterns 144, 150 and 154 may include silicon nitride. In example embodiments, the fifth to seventh insulation patterns 144, 150 and 154 may include silicon oxide.

In the memory device, leakage currents of the first selection pattern 110*b* may be decreased by the first barrier portion 114, and leakage currents of the second selection pattern 138*a* may be decreased by the second barrier portion 142. Thus, switching failures of the first and/or second selection patterns 110*b* and 138*a* due to the leakage currents may decrease. Also, memory cells may be exactly selected by the first and second selection patterns 110*b* and 138*a*, so that an operation failure of writing and/or reading due to the leakage currents may decrease.

FIGS. 1 and 2 show the memory device having memory cells at two levels. However, the inventive concepts need not be limited thereto. For example, the memory device may have memory cells provided in more than two levels.

FIGS. 5 to 20 are cross-sectional views illustrating stages of a method of manufacturing the variable resistance memory device shown in FIGS. 1 and 2 in accordance with example embodiments.

Figure 5:
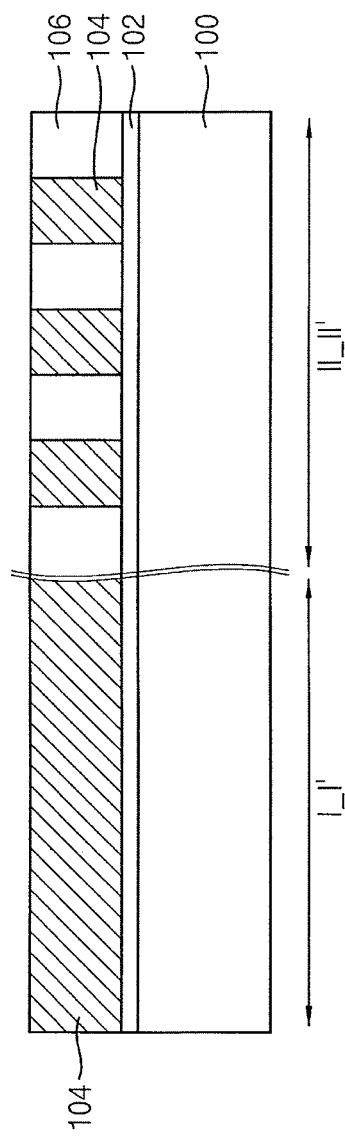
FIGS. 5 to 20 are cross-sectional views illustrating stages of a method of manufacturing the memory device shown in FIGS. 1 and 2 in accordance with example embodiments.

Referring to FIG. 5, a first conductive pattern 104 extending in the first direction may be formed on a substrate 100. A first insulation pattern 106 may be formed to fill a space between a plurality of first conductive patterns 104. For example, the first insulation pattern 106 may fill a space between two adjacent first conductive patterns 104.

In example embodiments, lower elements, e.g., transistors may be formed on the substrate 100, and an insulation layer 102 may be formed to cover the lower elements. The first conductive pattern 104 may be formed on the insulation layer 102.

In example embodiments, the first conductive pattern 104 may be formed by performing a photolithograph process. For example, a first conductive layer may be formed on the substrate 100. The first conductive layer may include, e.g., a metal or a metal nitride. In example embodiments, the first conductive layer may be formed to include a first barrier layer, a first metal layer and a second barrier layer sequentially stacked. A hard mask may be formed on the first conductive layer, and the first conductive layer may be etched using the hard mask as an etching mask to form the first conductive pattern 104 extending in the first direction. An insulation layer may be formed between a plurality of first conductive patterns 104. For example, the insulation layer may fill a space between two adjacent first conductive patterns 104, covering upper surfaces of the first conductive patterns 104. The insulation layer may be planarized to form the first insulation pattern 106. The hard mask may be removed.

In example embodiments, the first conductive pattern 104 may be formed by a damascene process. For example, a first insulation layer may be formed on the substrate 100. The first insulation layer may be partially etched to form an opening extending in the first direction, and the first insulation layer may be transformed into the first insulation pattern 106. A first conductive layer may be formed to fill the opening. For example, the first conductive layer may cover an upper surface of the first insulation pattern 106. The first conductive layer may be planarized until the upper surface of the first insulation pattern 106 may be exposed to form the first conductive pattern 104.

In example embodiments, the first conductive pattern 104 may serve as a first word line. In example embodiments, the first conductive pattern 104 may serve as a first bit line.

Figure 6:
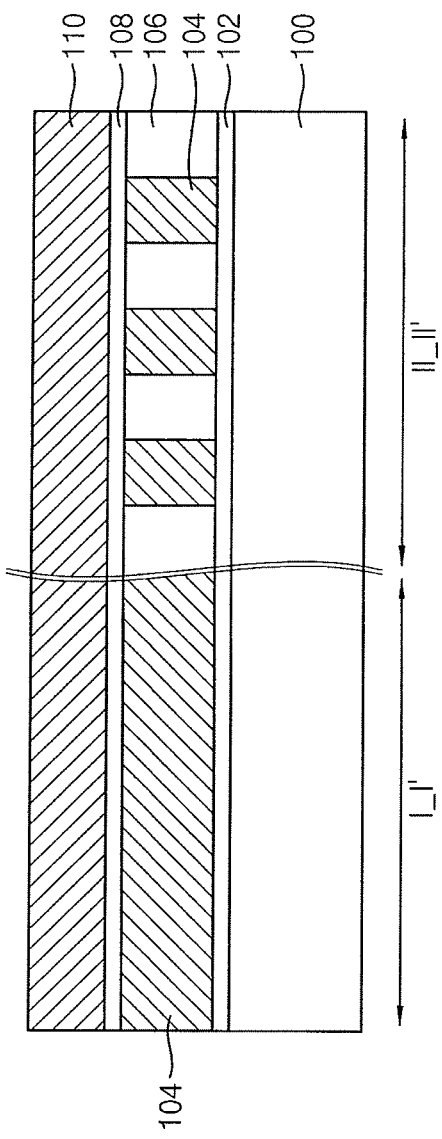

Referring to FIG. 6, a first lower electrode layer 108 and a first selection layer 110 may be sequentially formed on the first conductive pattern 104 and the first insulation pattern 106.

The first lower electrode layer 108 may be formed of a metal nitride or a metal silicon nitride. In some example embodiments, the first lower electrode layer 108 need not be formed.

In example embodiments, the first selection layer 110 may include an OTS material. The OTS material may include germanium (Ge), silicon (Si), arsenic (As) and/or tellurium (Te). Also, the OTS material may further include selenium (Se) and/or sulfur (S).

In example embodiments, a conductivity type of the first selection layer 110 may be a p type or a p– type. In example embodiments, a conductivity type of the first selection layer 110 may be an n type.

Figure 7:
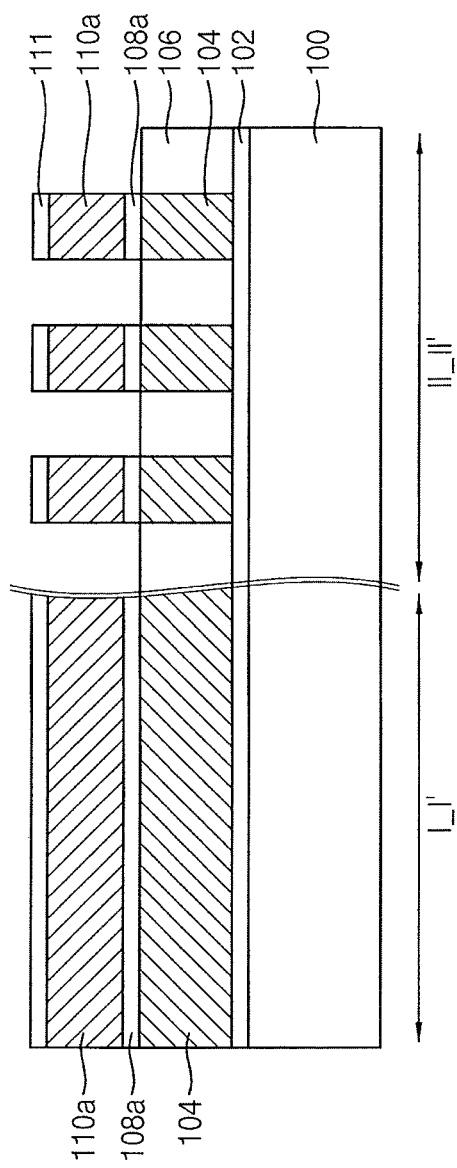
Figure 8:
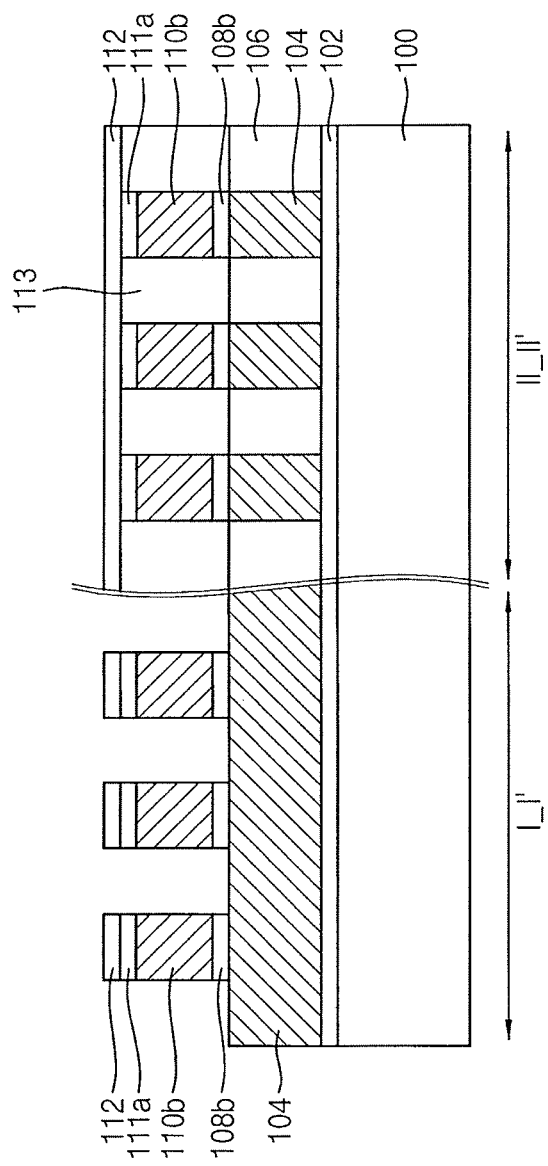

Referring to FIGS. 7 and 8, the first lower electrode layer 108 and the first selection layer 110 may be patterned to form a first lower electrode 108*b* and a first selection pattern 110*b*, respectively, on the first conductive pattern 104. A first structure including the first lower electrode 108*b* and a first selection pattern 110*b* sequentially stacked may have a pillar shape.

In example embodiments, the first selection layer 110 and the first lower electrode layer 108 may be etched using a preliminary first hard mask 111 extending in the first direction as an etching mask. The preliminary first hard mask 111, the first selection layer 110 and the first lower electrode layer 108 may be etched again using a second hard mask 112 extending in the second direction to form the first structure.

For example, referring to FIG. 7, the preliminary first hard mask 111 extending in the first direction may be formed on the first selection layer 110 by performing a photolithography process. The first selection layer 110 and the first lower electrode layer 108 may be anisotropically etched using the preliminary first hard mask 111 as an etching mask to form a preliminary first structure on the first conductive pattern 104. The preliminary first structure may include a preliminary first lower electrode 108*a*, a preliminary first selection pattern 110*a* and the preliminary first hard mask 111 sequentially stacked, and may extend in the first direction. A plurality of preliminary first structures may be arranged in the second direction.

Referring to FIG. 8, a sacrificial layer may be formed to fill a space between the preliminary first structures. The sacrificial layer may be planarized until an upper surface of the preliminary first structure may be exposed to form a first sacrificial pattern 113. The planarization process may include e.g., a chemical mechanical polishing (CMP) process, and/or an etch back process.

In example embodiments, the sacrificial layer may be filled in a space or a gap, and may be removed by an isotropical etching process. For example, the sacrificial layer may be formed of a spin on hardmask (SOH), and the SOH may include carbon.

A second hard mask layer may be formed on the preliminary first structure and the first sacrificial pattern 113, and the second hard mask layer may be patterned to form the second hard mask 112 extending in the second direction. The first sacrificial pattern 113, the preliminary first hard mask 111, the preliminary first selection pattern 110*a* and the preliminary first lower electrode 108*a* may be anisotropically etched using the second hard mask 112 as an etching mask to form the first lower electrode 108*b* and the first selection pattern 110*b*. Also, the first hard mask 111*a* may be formed on the first selection pattern 110*b*.

In example embodiments, the first lower electrode 108*b* and the first selection pattern 110*b* may be formed by forming a hard mask having a pillar shape on the first selection layer 110, and sequentially etching the first selection layer 110 and the first lower electrode layer 108 using the hard mask as an etching mask. In example embodiments, the hard mask having the pillar shape may be formed by a double patterning process. For example, each of preliminary hard masks extending in the first direction may be formed by a photolithograph process, and a sacrificial layer may be formed to fill a space between the preliminary hard masks. A photoresist pattern extending in the second direction may be formed on the sacrificial layer and the preliminary hard masks, and the preliminary hard masks may be etched using the photoresist pattern as an etching mask to form the hard mask.

Figure 9:
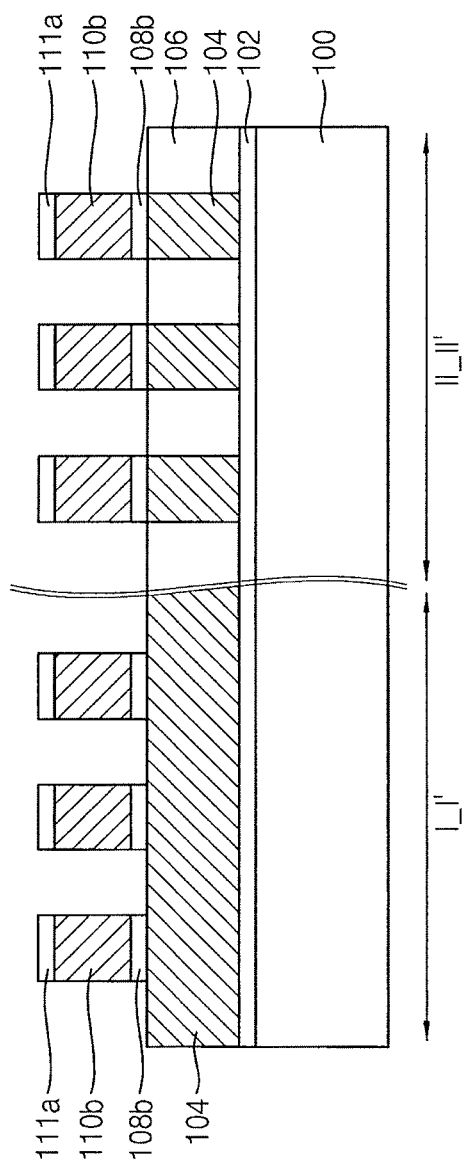

Referring to FIG. 9, the second hard mask 112 may be removed, and the first sacrificial pattern 113 may be removed.

In example embodiments, the first sacrificial pattern 113 may be removed by a wet etching process. In example embodiments, the first sacrificial pattern 113 may be removed by an ashing process and/or a stripping process.

As the first sacrificial pattern 113 is removed, a sidewall of the first selection pattern 110*b* may be exposed. However, an upper surface of the first selection pattern 110*b* may be covered with the first hard mask 111*a*.

Figure 10:
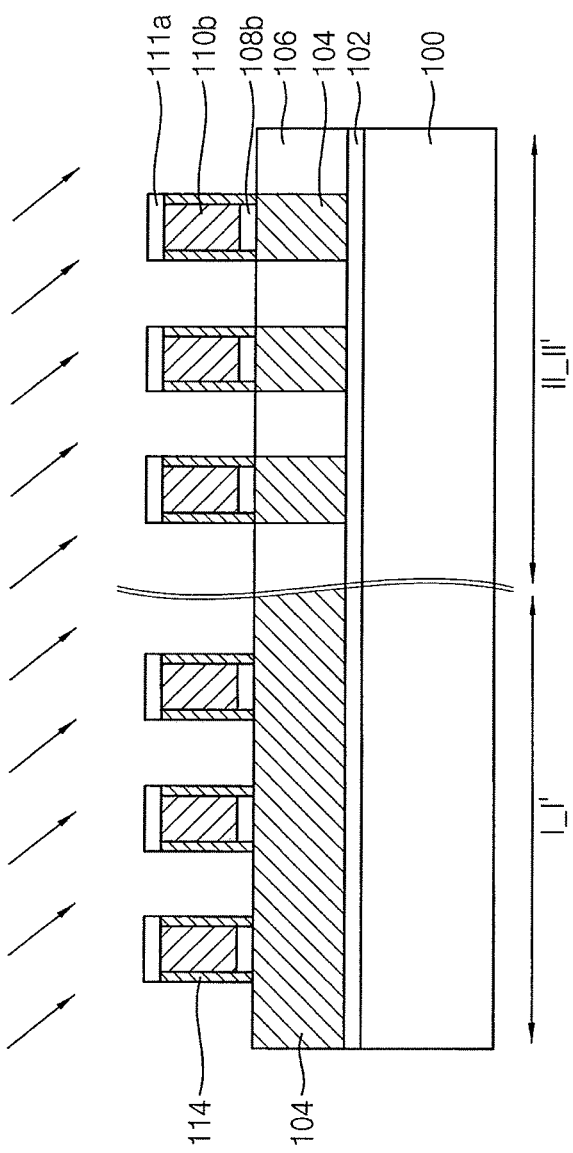

Referring to FIG. 10, the sidewall of the first selection pattern 110*b* may be doped with p type impurities, and thus a first barrier portion 114 may be formed to be adjacent to the sidewall of the first selection pattern 110*b*. Hereinafter, the sidewall of the first selection pattern 110*b* doped with the p type impurities may be referred to as a "doped sidewall portion".

In example embodiments, when a conductivity type of the first selection pattern 110*b* is a p type or a p– type, the first barrier portion 114 may be a p type doped region having a doping concentration greater than a doping concentration of the first selection pattern 110*b*.

Doping the p type impurities may be performed by a plasma doping process or an ion implantation process. In example embodiments, the p type impurities may be implanted into the substrate 100 at a predetermined angle with respect to the top surface of the substrate 100. In this case, the substrate 100 may be rotated to uniformly dope the p type impurities.

Thus, a p type doped region, a p+ doped region or a p++ doped region may be formed to surround the sidewall of the first selection pattern 110*b*, and may form the first barrier portion 114. In this case, the p type doped region, the p+ doped region or the p++ doped region of the first selection pattern 110*b* may be referred to as the "doped sidewall portion".

The energy levels between the central portion of the first selection pattern 110*b* and the first barrier portion 114 may be different from each other, and thus a potential well may be formed at the central portion of the first selection pattern 110*b*. For example, the potential well may be formed by a contact or a junction between the first selection pattern 110b and the first barrier portion 114.

Figure 11:
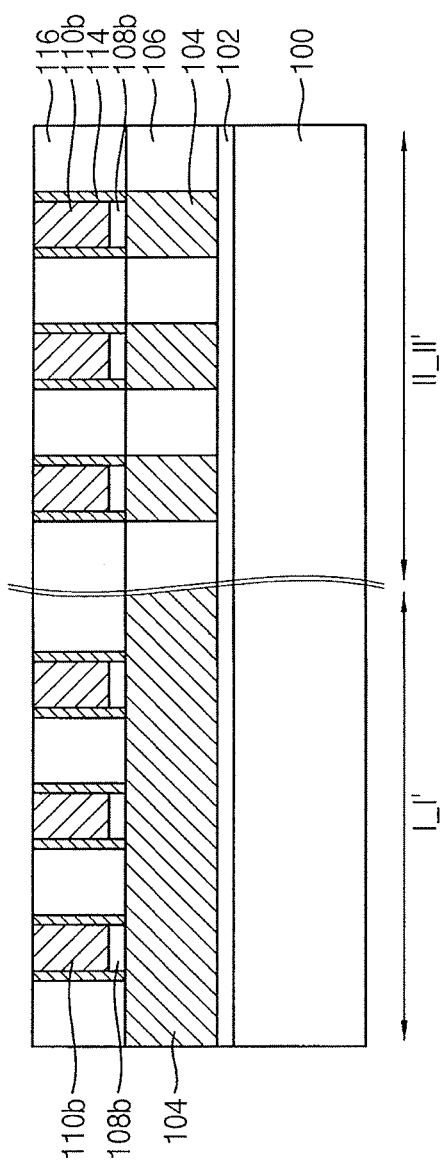

Referring to FIG. 11, a second insulation pattern 116 may be formed to fill a space between the first lower electrodes 108b and a space between the first selection patterns 110b.

In example embodiments, an insulation layer may be formed to completely fill the space between the first lower electrodes 108b and the space between the first selection patterns 110b. For example, the insulation layer may cover upper surfaces of the first selection patterns 110b. In example embodiments, the insulation layer may be formed of silicon nitride or silicon oxynitride. An upper surface of the insulation layer may be planarized until a top surface of the first hard mask 111a may be exposed, and the insulation layer may be partially etched to form the second insulation pattern 116 having a top surface lower than a top surface of the first hard mask 111a. The first hard mask 111a may be removed by, e.g., a wet etching process. Thus, an upper surface of the first selection pattern 110b may be exposed. Upper surfaces of the first selection pattern 110b and the second insulation pattern 116 may be substantially coplanar with each other.

Figure 12:
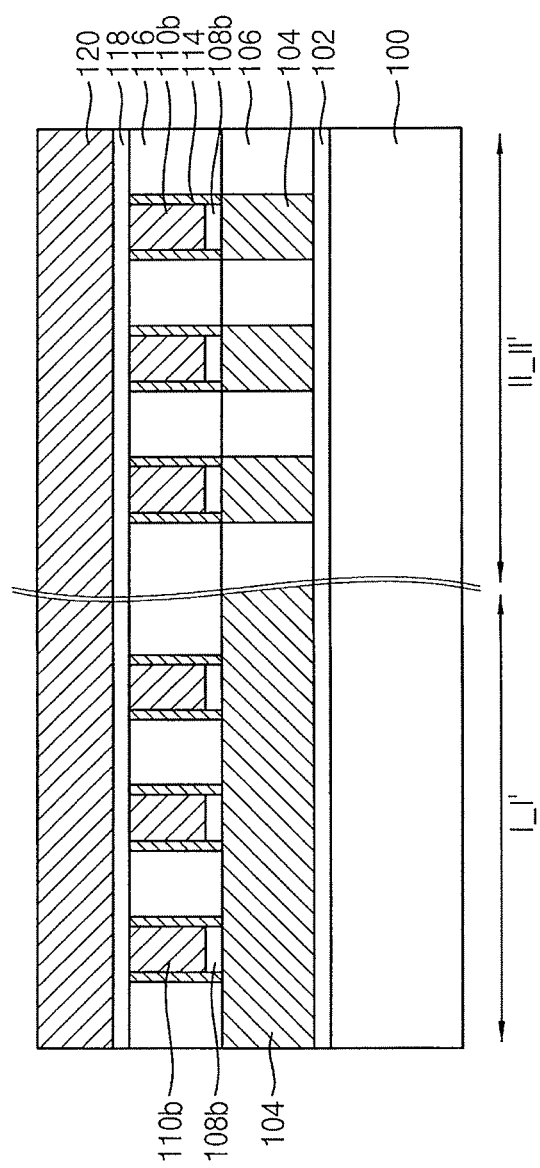

Referring to FIG. 12, a first electrode layer 118 and a first variable resistance layer 120 may be formed on the first selection pattern 110b and the second insulation pattern 116. In example embodiments, a first upper electrode layer (not shown) may be further formed on the first variable resistance layer 120.

In example embodiments, the first electrode layer 118 may be formed of, e.g., a metal nitride or a metal silicon nitride.

In example embodiments, the first variable resistance layer 120 may include a chalcogenide-based material in which Ge, Sb and/or Te are combined by a given ratio. In this case, the variable resistance memory device may be a PRAM device.

In some example embodiments, the first variable resistance layer 120 may include a material of which a resistance may be changed by a magnetic field or a spin transfer torque (STT).

In some example embodiments, the first variable resistance layer 120 may include, e.g., a transition metal oxide or a perovskite-based material.

Figure 13:
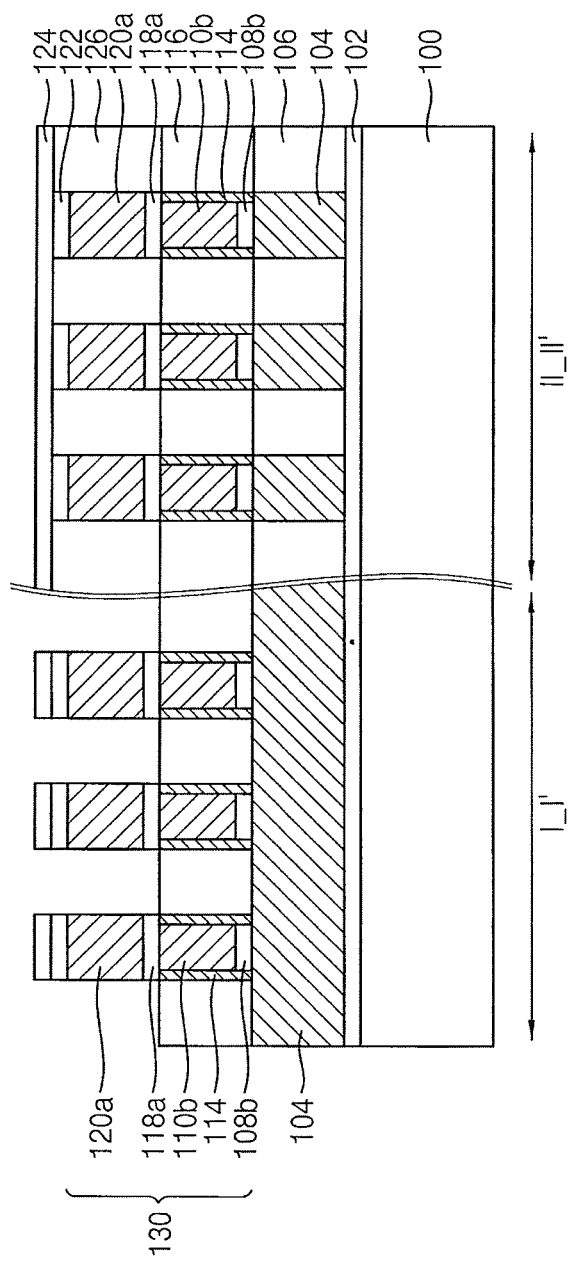

Referring to FIG. 13, the first variable resistance layer 120 and the first electrode layer 118 may be patterned to form a first electrode 118a and a first variable resistance pattern 120a, respectively, on the first selection pattern 110b.

In example embodiments, the first variable resistance layer 120 and the first electrode layer 118 may be etched using a preliminary third hard mask extending in the first direction as an etching mask. The preliminary third hard mask, the first variable resistance layer 120 and the first electrode layer 118 may be etched again using a fourth hard mask 124 extending in the second direction to form the first variable resistance pattern 120a and the first electrode 118a. For example, the first variable resistance pattern 120a and the first electrode 118a may be formed by performing processes substantially the same as or similar to the processes illustrated with reference to FIGS. 7 to 8.

For example, the preliminary third hard mask extending in the first direction may be formed on the first variable resistance layer 120. In example embodiments, the preliminary third hard mask may overlap the preliminary first hard mask. The first variable resistance layer 120 and the first electrode layer 118 may be anisotropically etched using the preliminary third hard mask as an etching mask to form a preliminary first variable resistance pattern and a preliminary first electrode, respectively. An insulation layer may be formed to fill a space between the preliminary first variable resistance patterns. The insulation layer may be planarized until an upper surface of the preliminary third hard mask may be exposed to form a preliminary third insulation pattern 126. The planarization process may include e.g., a chemical mechanical polishing (CMP) process, an etch back process, etc.

The fourth hard mask 124 extending in the second direction may be formed on the preliminary third hard mask and the preliminary third insulation pattern 126. The fourth hard mask 124 may overlap the second hard mask 112.

The preliminary third hard mask, the preliminary variable resistance pattern, the preliminary first electrode and the preliminary third insulation pattern 126 may be etched using the fourth hard mask 124 as an etching mask to form the first electrode 118a, the first variable resistance pattern 120a and a third hard mask 122 on the first selection pattern 110b.

Thus, a first cell structure 130 may be formed on the first conductive pattern 104.

Figure 14:
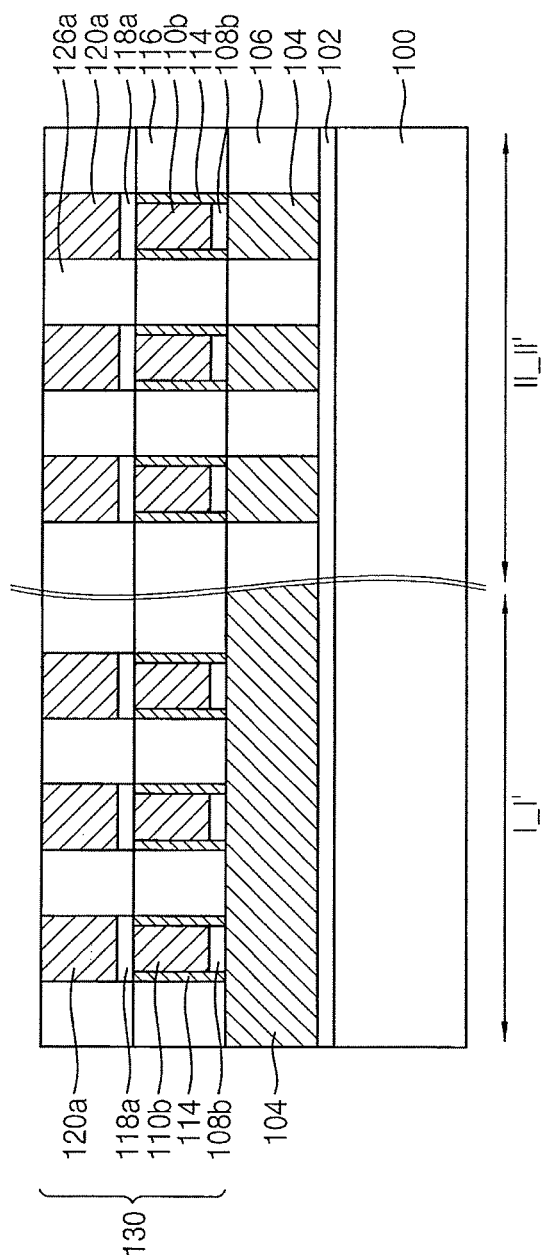

Referring to FIG. 14, an insulation layer may be formed to fill a space between structures including the first electrode 118a and the first variable resistance pattern 120a, and an upper surface of the insulation layer may be planarized. Thus, a third insulation pattern 126a may be formed between the structures.

The third and fourth hard masks 122 and 124 may be removed. In example embodiments, upper surfaces of a third insulation pattern 126a and the first variable resistance pattern 120a may be substantially coplanar with each other.

Figure 15:
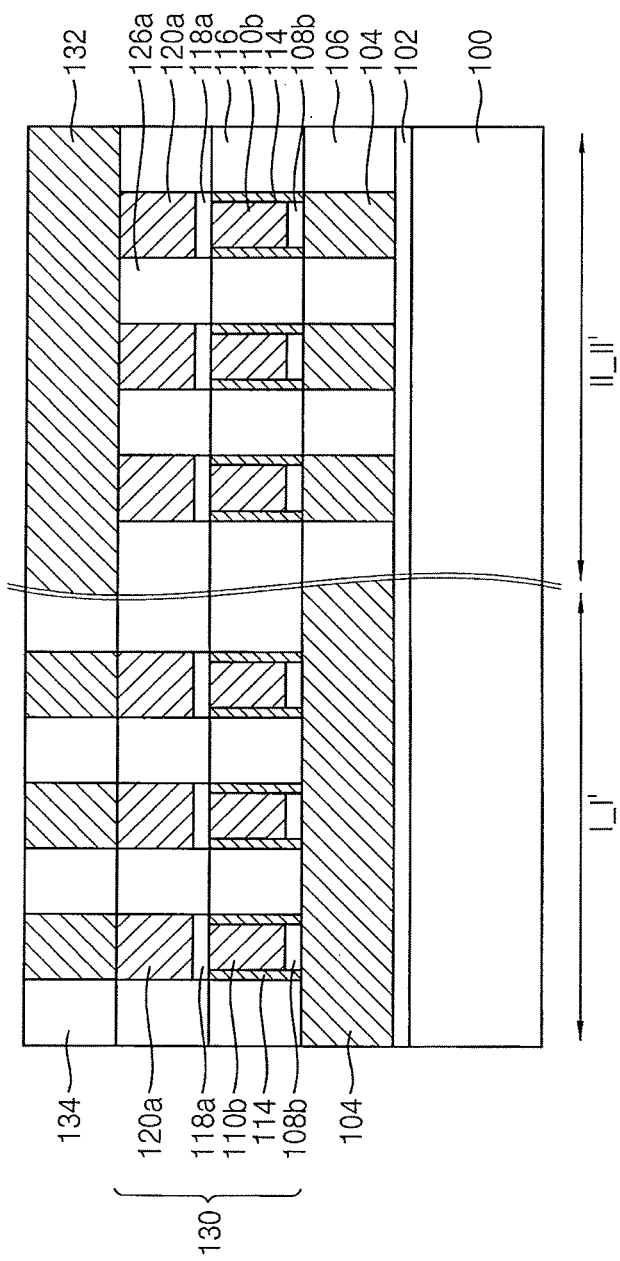

Referring to FIG. 15, a second conductive pattern 132 may be formed on the first variable resistance pattern 120a and the third insulation pattern 126a. The second conductive pattern 132 may contact the first variable resistance pattern 120a, and may extend in the second direction. A fourth insulation pattern 134 may be formed between a plurality of second conductive patterns 132.

In example embodiments, a second conductive layer may be formed on the first variable resistance pattern 120a and the third insulation pattern 126a, and a fifth hard mask (not shown) may be formed on the second conductive layer. The second conductive layer may be etched using the fifth hard mask as an etching mask to form the second conductive pattern 132. An insulation layer may be formed to fill a space between the second conductive patterns 132. The insulation layer may be planarized until a top surface of the second conductive pattern 132 may be exposed to form the fourth insulation pattern 134. Upper surfaces of the fourth insulation pattern 134 and the second conductive pattern 132 may be substantially coplanar with each other.

In example embodiments, the second conductive pattern 132 may be formed by a damascene process. For example, an insulation layer may be formed on the first variable resistance pattern 120a and the third insulation pattern 126a. The insulation layer may be partially etched to form a trench extending in the second direction, and the insulation layer may be transformed into the fourth insulation pattern 134. A conductive layer may be formed to fill the trench. The conductive layer may be planarized until an upper surface of the fourth insulation pattern 134 may be exposed to form the second conductive pattern 132.

Thus, the first cell structure may be formed at a crosspoint of the first and second conductive patterns 104 and 132. The first cell structure may include the first selection pattern 110b, the first barrier portion 114, the first electrode 118a and the first variable resistance pattern 120a.

Processes substantially the same as or similar to the processes illustrated with reference to FIGS. 6 to 14 may be performed to form the second cell structure 158 of FIG. 2 on the second conductive pattern 132 and the fourth insulation pattern 134. Hereinafter, a method of forming the second cell structure may be briefly described.

Figure 16:
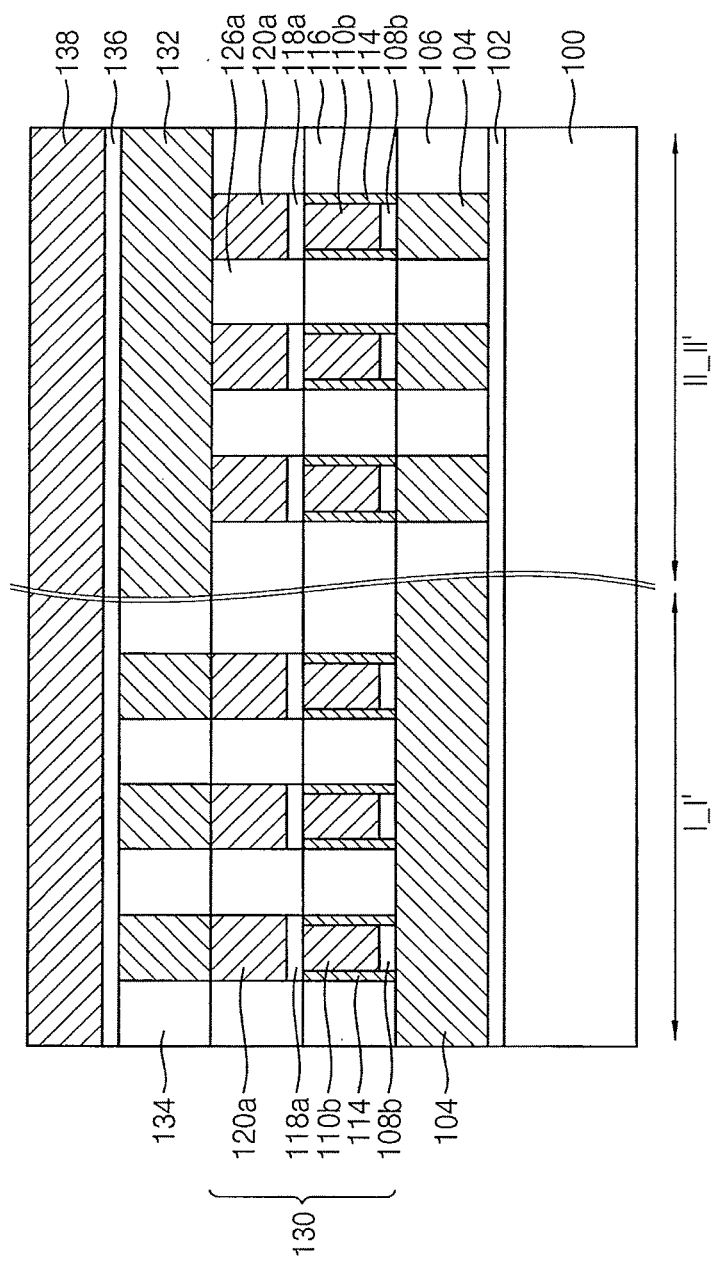

Referring to FIG. 16, a second lower electrode layer 136 and a second selection layer 138 may be formed on the second conductive pattern 132 and the fourth insulation pattern 134.

In example embodiments, the second lower electrode layer 136 may include a material substantially the same as a material of the first lower electrode layer 108, and the second selection layer 138 may include a material substantially the same as a material of the first selection layer 110.

In example embodiments, the second selection layer 138 may include an OTS material. In example embodiments, a conductivity type of the second selection layer 138 may be p type or p− type. In some example embodiments, a conductivity type of the second selection layer 138 may be an n type.

Figure 17:
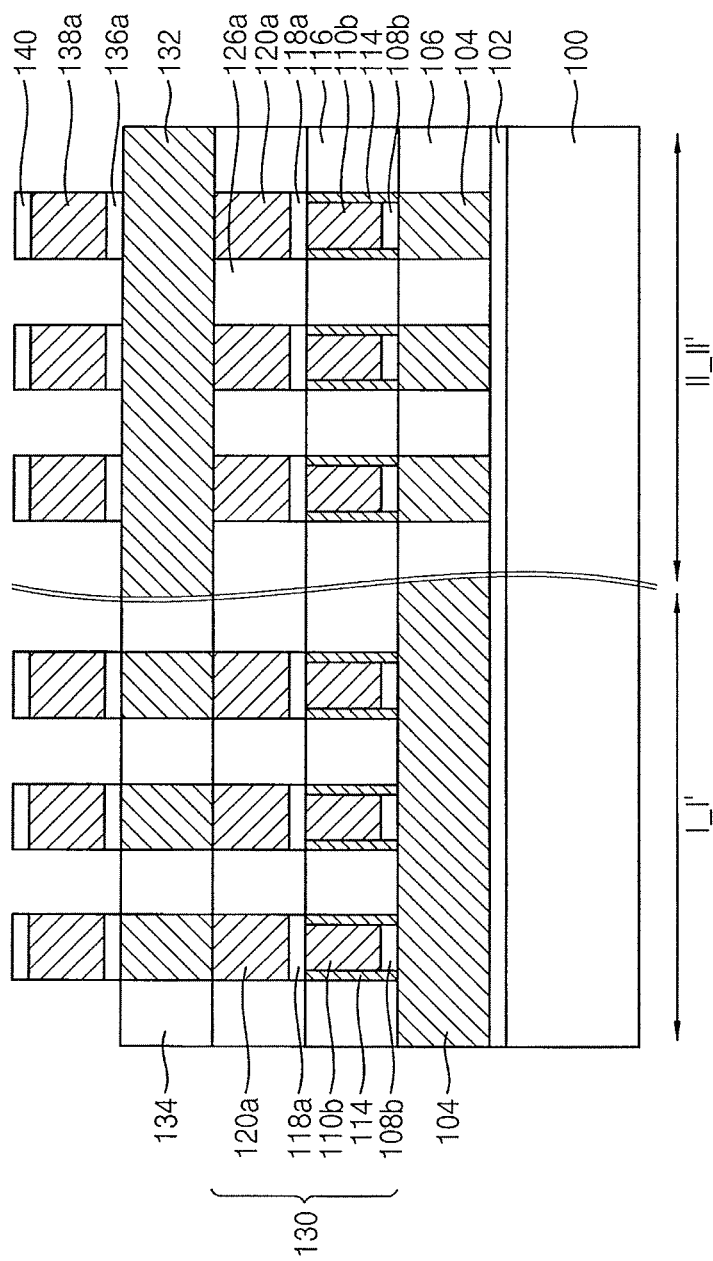

Referring to FIG. 17, the second selection layer 138 and the second lower electrode layer 136 may be patterned to form a second lower electrode 136a and a second selection pattern 138a, respectively, on the second conductive pattern 132. A fifth hard mask 140 may be formed on the second selection pattern 138a.

In example embodiments, the second selection layer 138 and the second lower electrode layer 136 may be patterned by performing processes substantially the same as or similar to the processes illustrated with reference to FIGS. 7 to 9. Thus, the second lower electrode 136a and the second selection pattern 138a may be formed to have a pillar shape. Also, the second lower electrode 136a and the second selection pattern 138a may be aligned with the first cell structure 130 in the third direction.

In example embodiments, the second selection layer 138 and the second lower electrode layer 136 may be patterned using a hard mask having a pillar shape as an etching mask to form the second selection pattern 138a and the second lower electrode 136a, respectively.

Figure 18:
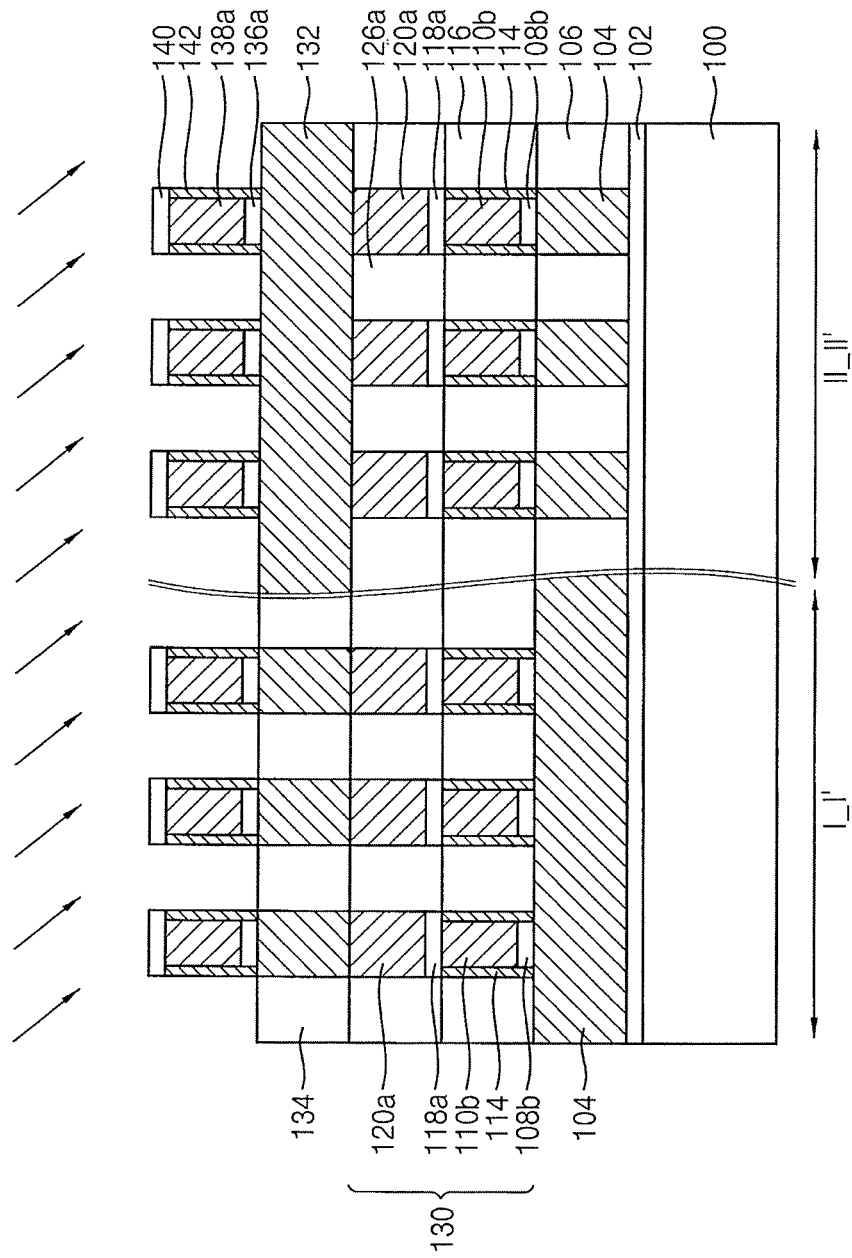

Referring to FIG. 18, a sidewall of the second selection pattern 138a may be doped with p type impurities, and thus a second barrier portion 142 may be formed to be adjacent to the sidewall of the second selection pattern 138a.

Doping the p type impurities may be performed by a plasma doping process or an ion implantation process. For the ion implantation process, the p type impurities may be implanted into the substrate 100 at a predetermined angle with respect to the top surface of the substrate 100. In this case, the substrate 100 may be rotated so that the p type impurities are uniformly doped.

Thus, a p+ doped region or a p++ doped region may surround the sidewall of the second selection pattern 138a, and may form the second barrier portion 142. The energy levels of the central portion of the second selection pattern 138a and the second barrier portion 142 may be different from each other, and thus a potential well may be formed at the central portion of the second selection pattern 138a.

Figure 19:
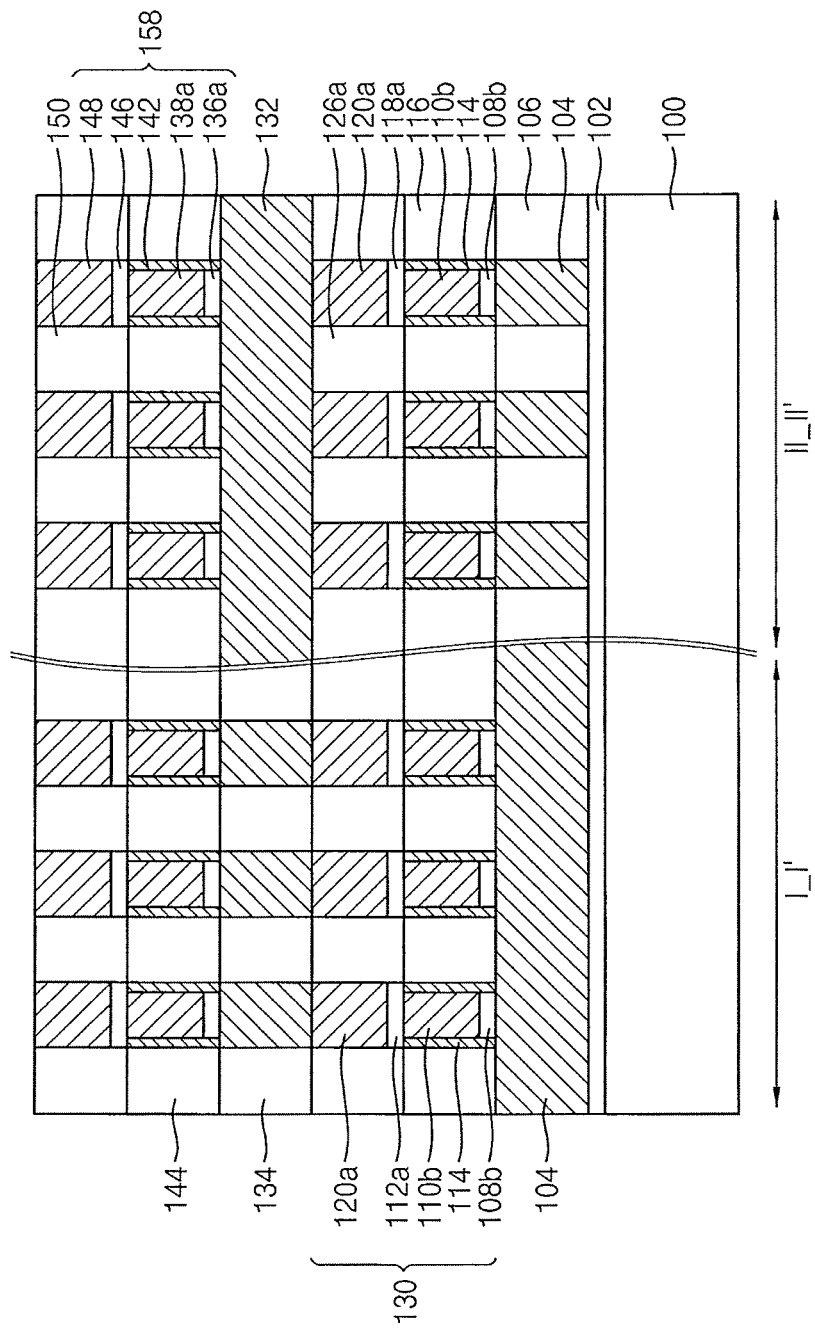

Referring to FIG. 19, a fifth insulation pattern 144 may be formed to fill a space between the second selection patterns 138a.

A second electrode layer and the second variable resistance layer may be formed on the second selection pattern 138a and the fifth insulation pattern 144. In example embodiments, a second upper electrode layer may be further formed on the second variable resistance layer.

The second electrode layer may include a material as substantially the same as a material of the first electrode layer 118, and the second variable resistance layer may include a material as substantially the same as a material of the first variable resistance layer 120. Also the second upper electrode layer may include a material substantially the same as a material of the first upper electrode layer.

The second electrode layer, the second variable resistance layer and the second upper electrode layer may be formed by performing processes substantially the same as or similar to the processes illustrated with reference to FIG. 12.

The second electrode layer and the second variable resistance layer may be patterned to form a second electrode 146 and a second variable resistance pattern 148, respectively, on the second selection pattern 138a. A sixth insulation pattern 150 may be formed to fill a space between the second electrodes 146 and a space between the second variable resistance patterns 148.

Processes of patterning the second electrode layer and the second variable resistance layer and forming the sixth insulation pattern 150 may be substantially the same as or similar to the processes illustrated with reference to FIG. 13.

Thus, the second cell structure 158 may be formed on the second conductive pattern 132. The second cell structure 158 may include the second lower electrode 136a, the second selection pattern 138a, the second barrier portion 142, the second electrode 146 and the second variable resistance pattern 148.

Figure 20:
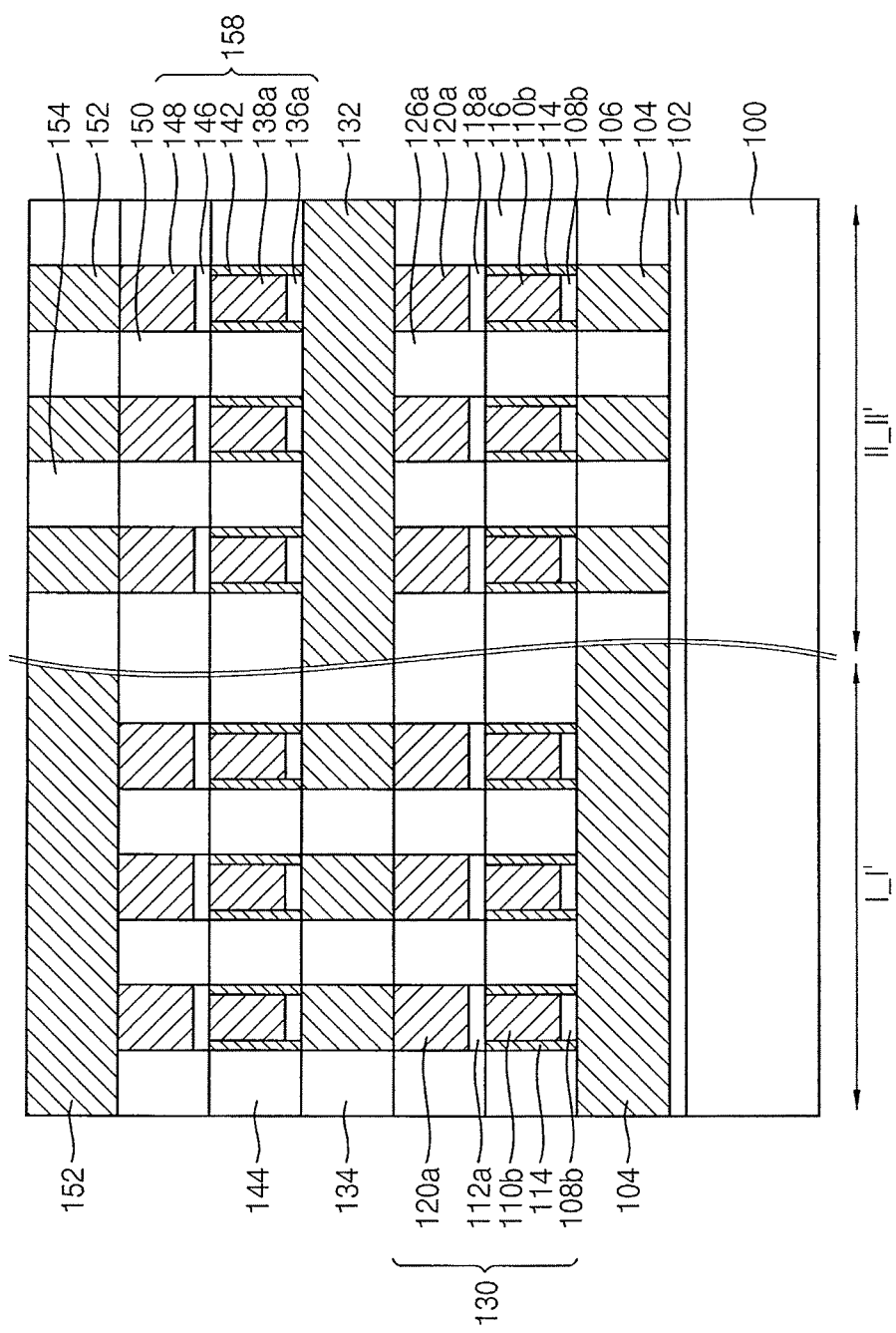

Referring to FIG. 20, a third conductive pattern 152 may be formed on the second variable resistance pattern 148 and the sixth insulation pattern 150. The third conductive pattern 152 may contact the second variable resistance pattern 148, and may extend in the first direction. The third conductive pattern 152 may overlap the first conductive pattern 104. A seventh insulation pattern 154 may be formed to fill a space between the third conductive patterns 152.

In example embodiments, a third conductive layer may be formed on the second variable resistance pattern 148 and the sixth insulation pattern 150. The third conductive layer may be patterned to form the third conductive pattern 152. In example embodiments, the third conductive pattern 152 may be formed by a damascene process.

Processes of forming the third conductive pattern 152 may be substantially the same as or similar to the processes of forming the first conductive pattern 104 illustrated with reference to FIG. 5.

Thus, the second cell structure 158 may be formed at each cross-point of the second and third conductive patterns 132 and 152.

In example embodiments, the processes may be repeatedly performed as described above, so that memory device may include memory cells stacked at more than two levels. In some example embodiments, the processes illustrated with reference to FIGS. 5 to 15 may be performed, so that the memory device may include memory cells at one level.

FIGS. 21 to 26 are cross-sectional views illustrating stages of a method of manufacturing the variable resistance memory device shown in FIGS. 1 and 2 in accordance with example embodiments.

The variable resistance memory device may be manufactured by performing processes substantially the same as or similar to the processes illustrated with reference to FIGS. 5 to 20, except for the patterning of the first and second conductive patterns and the first and second cell structures.

Figure 21:
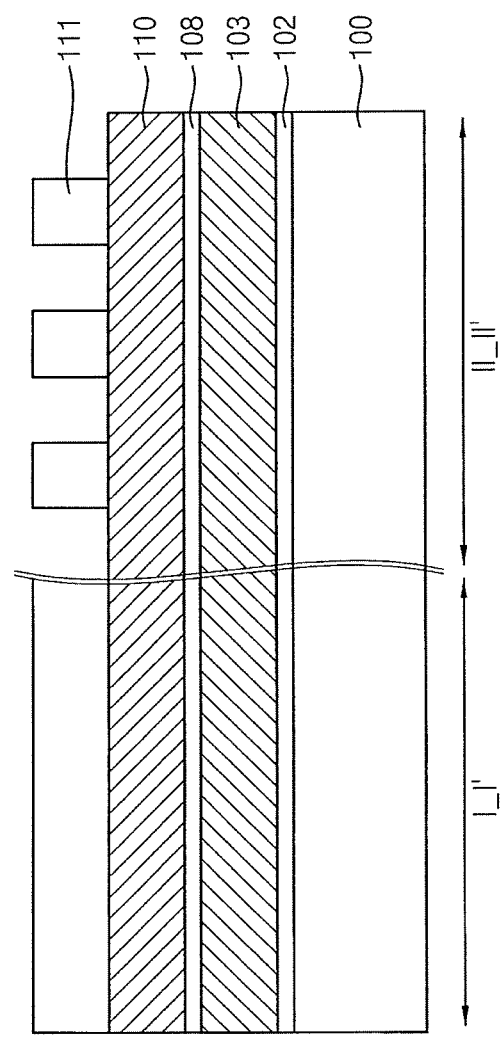
FIGS. 21 to 26 are cross-sectional views illustrating stages of a method of manufacturing a memory device in accordance with example embodiments.

Referring to FIG. 21, a first conductive layer 103, the first lower electrode layer 108 and the first selection layer 110 may be sequentially formed on the substrate 100. The preliminary first hard mask 111 extending in the first direction may be formed on the first selection layer 110.

Figure 22:
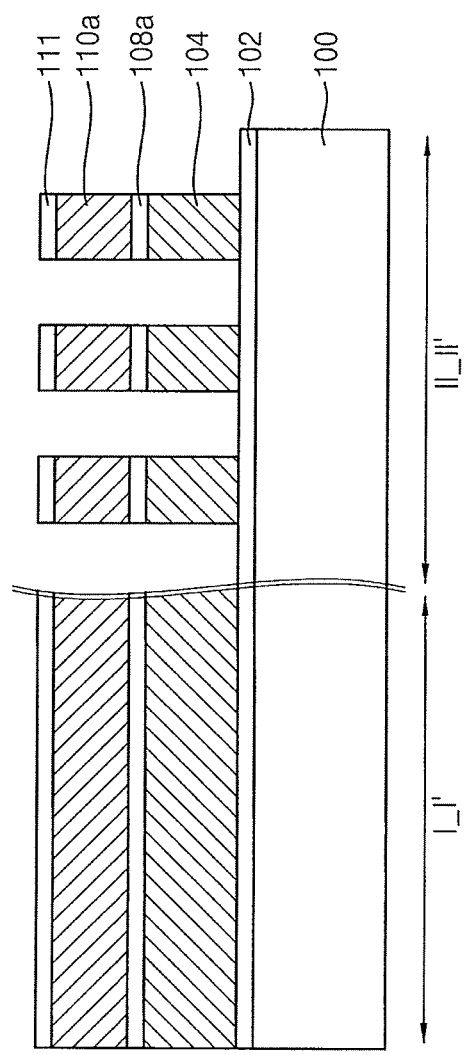

Referring to FIG. 22, the first selection layer 110, the first lower electrode layer 108 and the first conductive layer 103 may be sequentially and anisotropically etched using the preliminary first hard mask 111 as an etching mask to form a preliminary first structure on the substrate 100. The preliminary first structure may include the first conductive pattern 104, the preliminary first lower electrode 108a, the preliminary first selection pattern 110a and the preliminary first hard mask 111 sequentially stacked.

The thickness of the preliminary first hard mask 111 of FIG. 21 may be reduced while the first selection layer 110, the first lower electrode layer 108 and the first conductive layer 103 may be anisotropically etched. In this case, the thickness of the preliminary first hard mask 111 of FIG. 22 is smaller than the thickness of the preliminary first hard mask 111 of FIG. 21.

The preliminary first structure may extend in the first direction, and a plurality of preliminary first structures may be arranged in the second direction.

In example embodiments, when the first conductive pattern 104 is formed, the first selection layer 110 and the first lower electrode layer 108 may be etched to form the preliminary first selection pattern 110a and the preliminary first lower electrode 108a, respectively.

Figure 23:
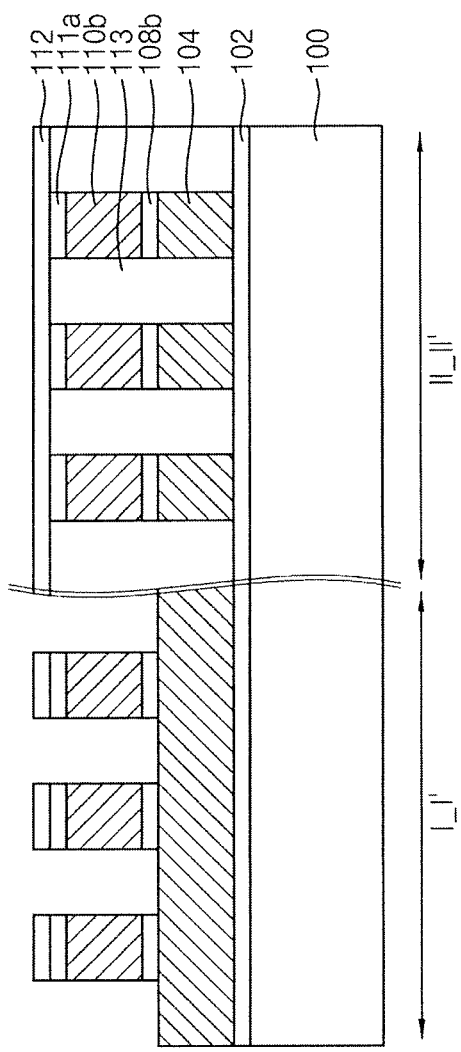

Referring to FIG. 23, a sacrificial layer may be formed to fill a space between the preliminary first structures. The sacrificial layer may be planarized until an upper surface of the preliminary first structure may be exposed to form the first sacrificial pattern 113. The planarization process may include e.g., a chemical mechanical polishing (CMP) process, an etch back process.

The second hard mask 112 extending in the second direction may be formed on the preliminary first structure and the first sacrificial pattern 113.

The first sacrificial pattern 113, the preliminary first hard mask 111, the preliminary first selection pattern 110a and the preliminary first lower electrode 108a may be anisotropically etched using the second hard mask 112 as an etching mask to form the first lower electrode 108b and the first selection pattern 110b.

Figure 24:
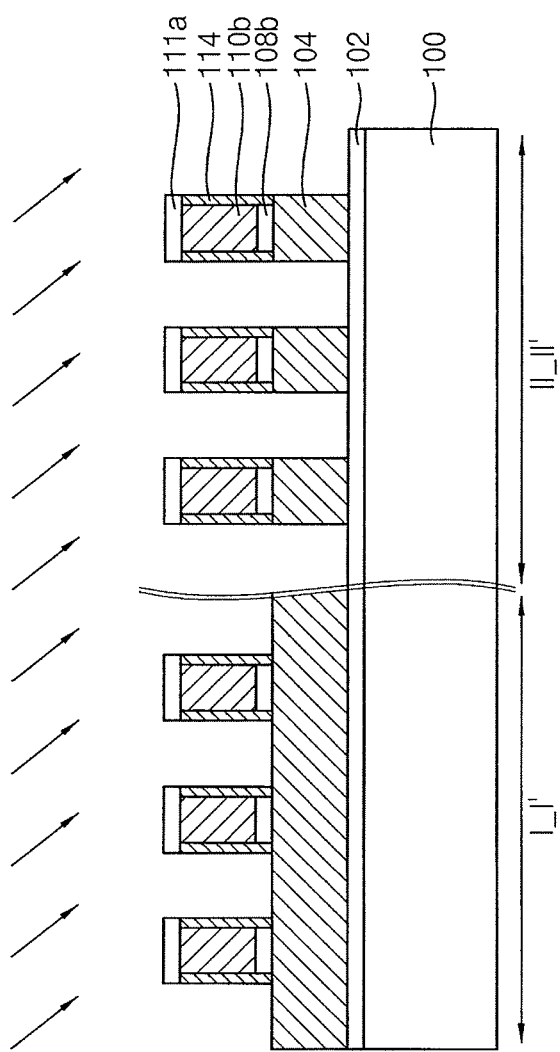

Referring to FIG. 24, the second hard mask 112 may be removed, and the first sacrificial pattern 113 may be removed. As the first sacrificial pattern 113 is removed, a sidewall of the first selection pattern 110b may be exposed. However, an upper surface of the first selection pattern 110b may be covered with the first hard mask 111a.

The sidewall of the first selection pattern 110b may be doped with p type impurities, and thus the first barrier portion 114 may be formed to be adjacent to the sidewall of the first selection pattern 110b.

The above processes may be substantially the same as or similar to the processes illustrated with reference to FIGS. 9 and 10.

Figure 25:
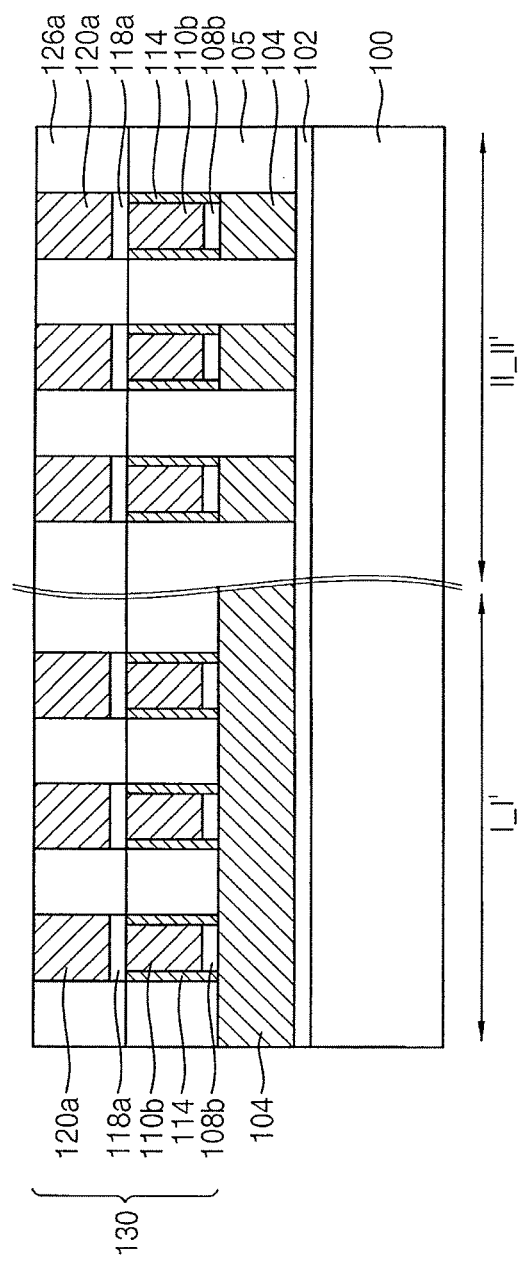

Referring to FIG. 25, an insulation pattern 105 may be formed to fill a space between structures including the first conductive pattern 104, the first lower electrode 108b and the first selection pattern 110b.

The first electrode 118a and the first variable resistance pattern 120a may be formed on the insulation pattern 105 and the first selection pattern 110b. The third insulation pattern 126a may be formed to fill between a space between structures including the first electrode 118a and the first variable resistance pattern 120a. The above processes may be substantially the same as or similar to the processes illustrated with reference to FIGS. 12 to 14.

Thus, the first cell structure 130 may be formed on the first conductive pattern 104.

Figure 26:
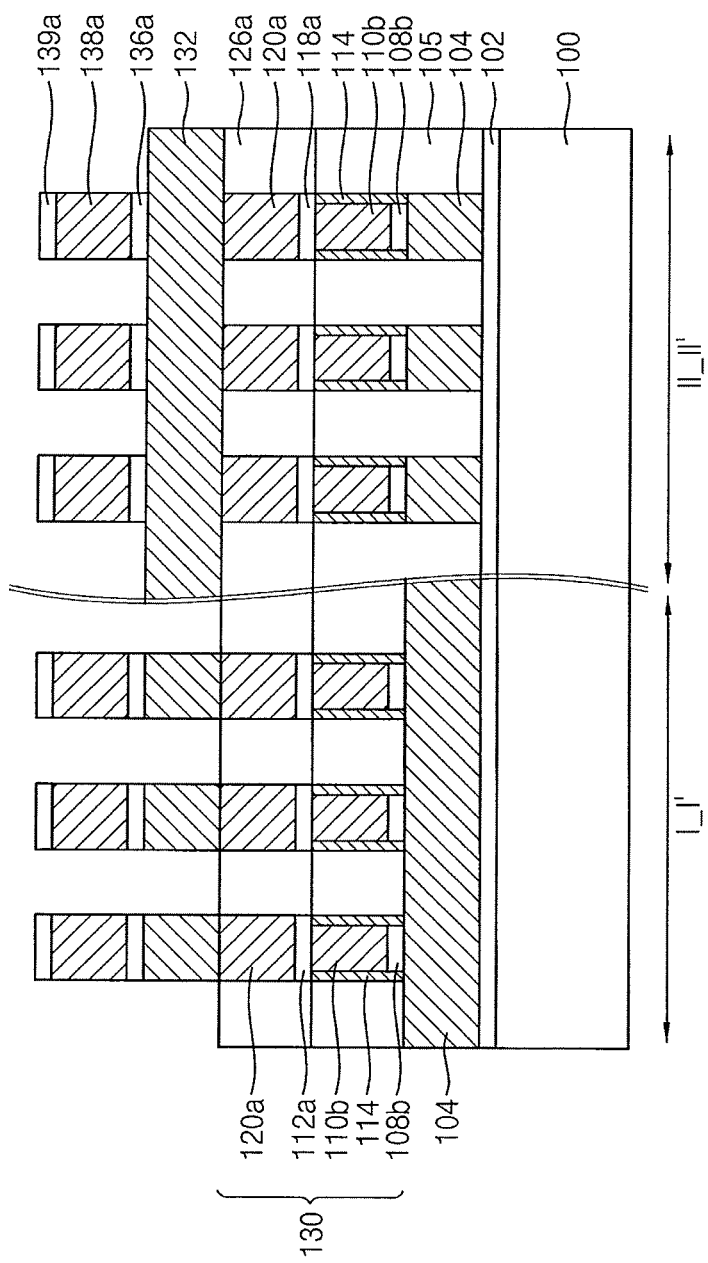

Referring to FIG. 26, the second conductive pattern 132, the second lower electrode 136a and the second selection pattern 138a may be formed on the first cell structure 130 and the third insulation pattern 126a.

For example, a second conductive layer, a second lower electrode layer and a second selection layer may be formed on the first variable resistance pattern 120a and the third insulation pattern 126a. The second conductive layer, the second lower electrode layer and the second selection layer may be patterned using the preliminary third hard mask as an etching mask to form the second conductive pattern 132, a preliminary second conductive pattern and a preliminary second selection pattern, respectively. Each of the second conductive pattern 132, the preliminary second conductive pattern and the preliminary second selection pattern may extend in the second direction.

A second sacrificial pattern may be fill a space between structures each including the second conductive pattern 132, the preliminary second conductive pattern and the preliminary second selection pattern.

A fourth hard mask extending in the first direction may be formed on the preliminary third hard mask and the second sacrificial pattern. The preliminary third hard mask, the preliminary second lower electrode and the preliminary second selection pattern may be etched using the fourth hard mask as an etching mask. Thus, the second lower electrode 136a and the second selection pattern 138a having a pillar shape may be formed on the second conductive pattern 132. Also, a third hard mask 139a may be formed on the second selection pattern 138a.

Referring to FIGS. 1 and 2 again, the fourth hard mask and the second sacrificial pattern may be removed, so that a sidewall of the second selection pattern 138a may be exposed.

The sidewall of the second selection pattern 138a may be doped with p type impurities, and thus a second barrier portion 142 may be formed to be adjacent to the sidewall of the second selection pattern 138a. An insulation pattern may be formed to fill a space between the second conductive patterns 132 and a space between the second selection patterns 138a.

The second electrode 146 and the second variable resistance pattern 148 may be formed on the insulation pattern and the second selection pattern 138a. The sixth insulation pattern 150 may be formed to fill a space between the second variable resistance patterns 148.

The above processes may be substantially the same as or similar to the processes illustrated with reference to FIGS. 24 and 25.

The third conductive pattern 152 may be formed on the second variable resistance pattern 148 and the sixth insulation pattern 150. A seventh insulation pattern 154 may be formed to fill a space between the third conductive patterns 152.

FIGS. 27 to 31 are cross-sectional views illustrating stages of a method of manufacturing the variable resistance memory device in accordance with example embodiments.

Figure 27:
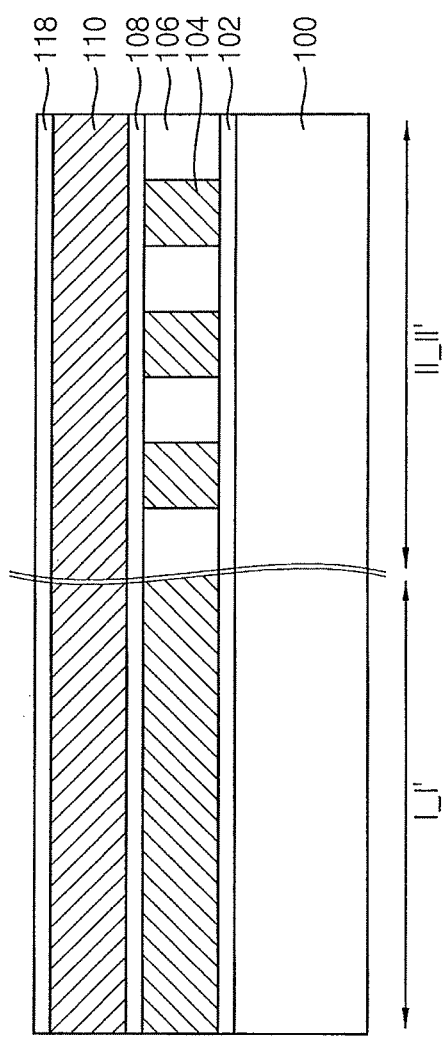
FIGS. 27 to 31 are cross-sectional views illustrating stages of a method of manufacturing a memory device in accordance with example embodiments.

Referring to FIG. 27, the first conductive pattern 104 extending in the first direction may be formed on the substrate 100. The first insulation pattern 106 may be formed to fill a space between the first conductive patterns 104. The first conductive pattern 104 and the first insulation pattern 106 may be formed by performing processes substantially the same as or similar to the processes illustrated with reference to FIG. 5.

The first lower electrode layer 108, the first selection layer 110 and the first electrode layer 118 may be sequentially formed on the first conductive pattern 104 and the first insulation pattern 106.

Figure 28:
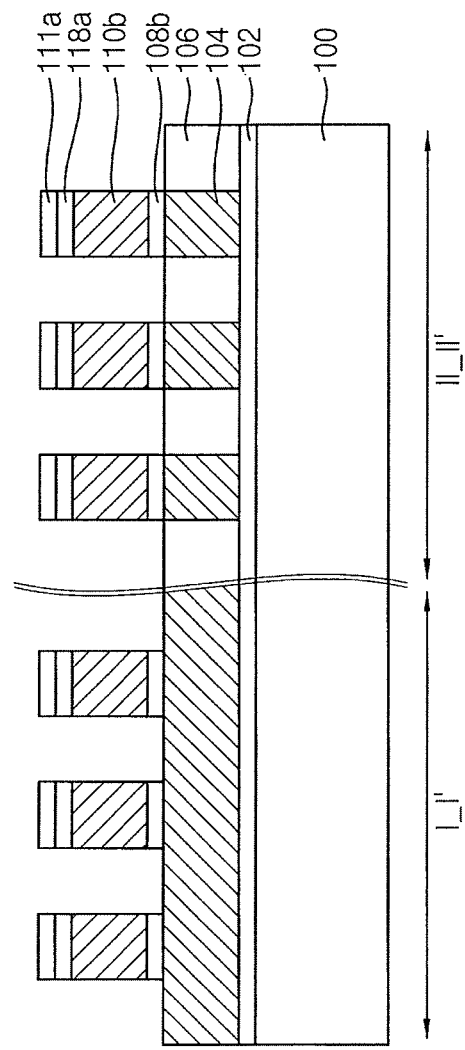

Referring to FIG. 28, the first electrode layer 118, the first selection layer 110 and the first lower electrode layer 108 may be patterned to form the first lower electrode 108b, the first selection pattern 110b and the first electrode 118a on the first conductive pattern 104. The first hard mask 111a may be formed on the first electrode 118a.

The above processes may be substantially the same as or similar to the processes illustrated with reference to FIGS. 7 to 9.

Figure 29:
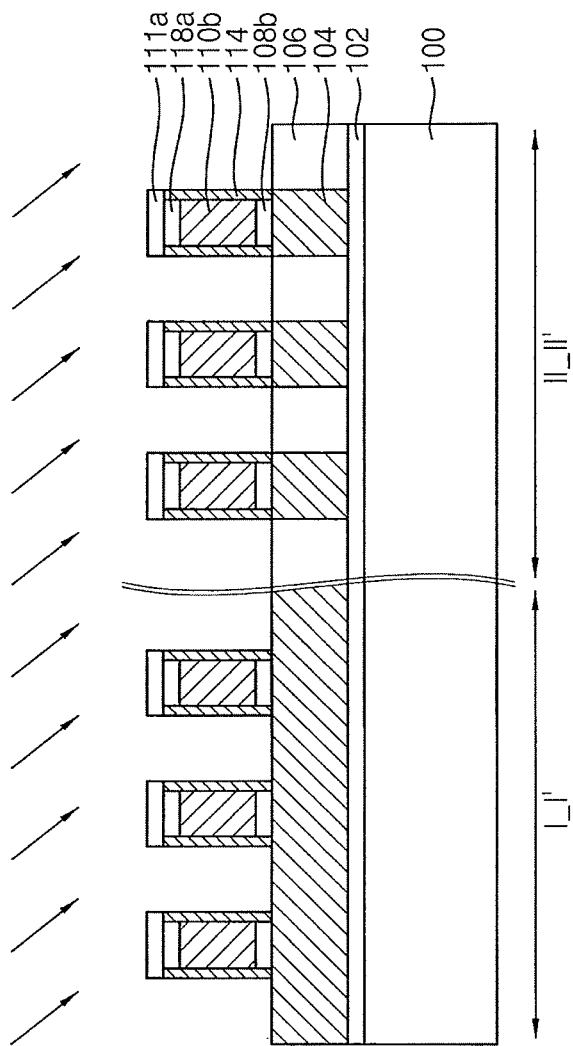

Referring to FIG. 29, a sidewall of the first selection pattern 110b may be doped with p type impurities, and thus the first barrier portion 114 may be formed at the sidewall of the first selection pattern 110b.

In example embodiments, the first electrode 118a may be disposed on the first selection pattern 110b, so that a sidewall of the first electrode 118a may be also doped with p type impurities.

In example embodiments, the first hard mask 111a may be removed.

Figure 30:
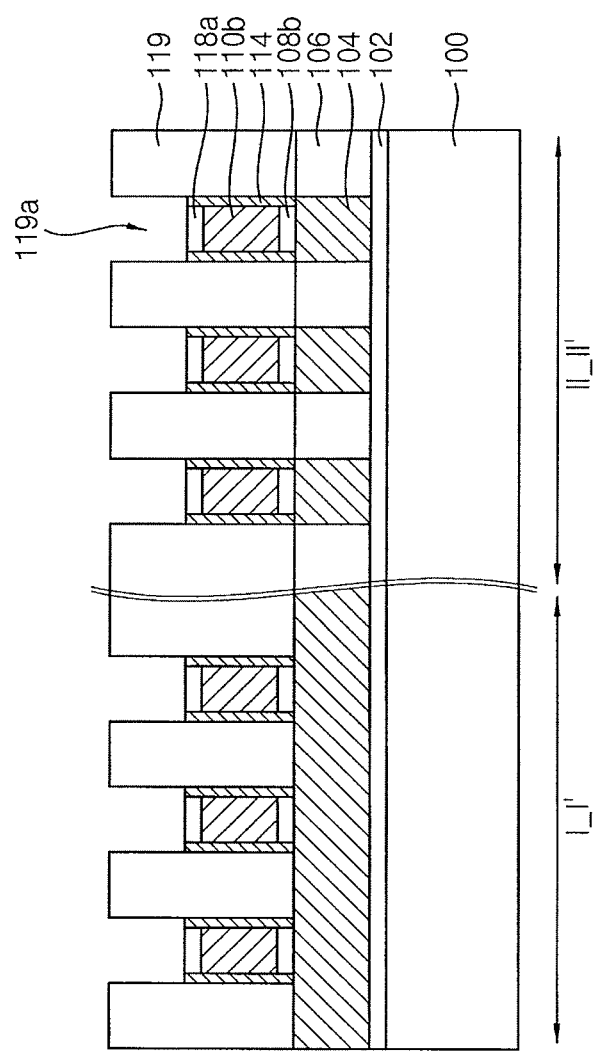

Referring to FIG. 30, a second insulation layer 119 may be formed to fill a space between structures each including the first lower electrode 108b, the first selection pattern 110b and the first electrode 118a, and the second insulation layer 119 may cover the structures.

The second insulation layer 119 may be partially etched to form an opening 119a exposing an upper surface of the first electrode 118a. In example embodiments, when the opening 119a is formed, the first hard mask 111a may be also removed. In this case, the first hard mask 111a may be removed after the formation of the opening 119a.

Figure 31:
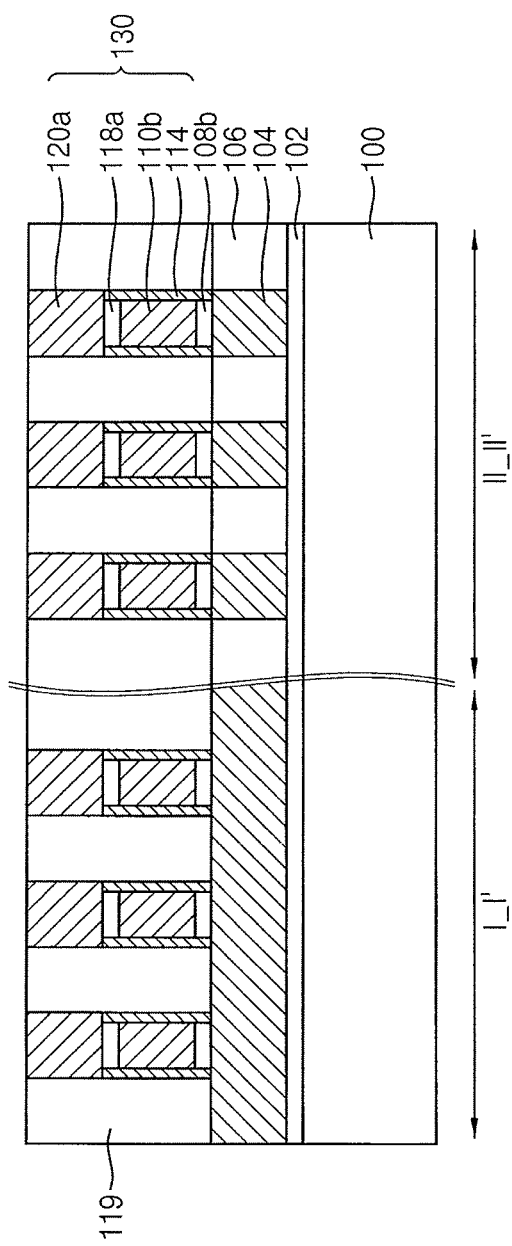

Referring to FIG. 31, a first variable resistance layer may be formed to fill the opening 119a. The first variable resistance layer may be planarized until an upper surface of the second insulation layer 119 may be exposed to form the first variable resistance pattern 120a. For example, the first variable resistance pattern 120a may be formed by a damascene process.

Thus, the first cell structure 130 may be formed on the first conductive pattern 104.

A second conductive pattern may be formed on the first cell structure 130 and the second insulation layer 119. The second conductive pattern may be formed by performing processes substantially the same as or similar to the processes illustrated with reference to FIG. 15.

As shown in FIG. 2, the second cell structure 158 may be formed on the second conductive pattern 132. Processes for forming the second cell structure 158 may be substantially the same as or similar to processes for forming the first cell structure 130. For example, the second cell structure 158 may be formed by performing the processes illustrated with reference to FIGS. 27 to 31.

The third conductive pattern 152 extending in the first direction may be formed on the second cell structure 158. Thus, a memory device similar to the memory device of FIGS. 1 and 2 in accordance with example embodiments may be manufactured except for the first electrode 118a. For example, the first electrode 118a of FIG. 31 may be partially doped when the sidewall of the first selection pattern 110b may be doped.

Figure 32:
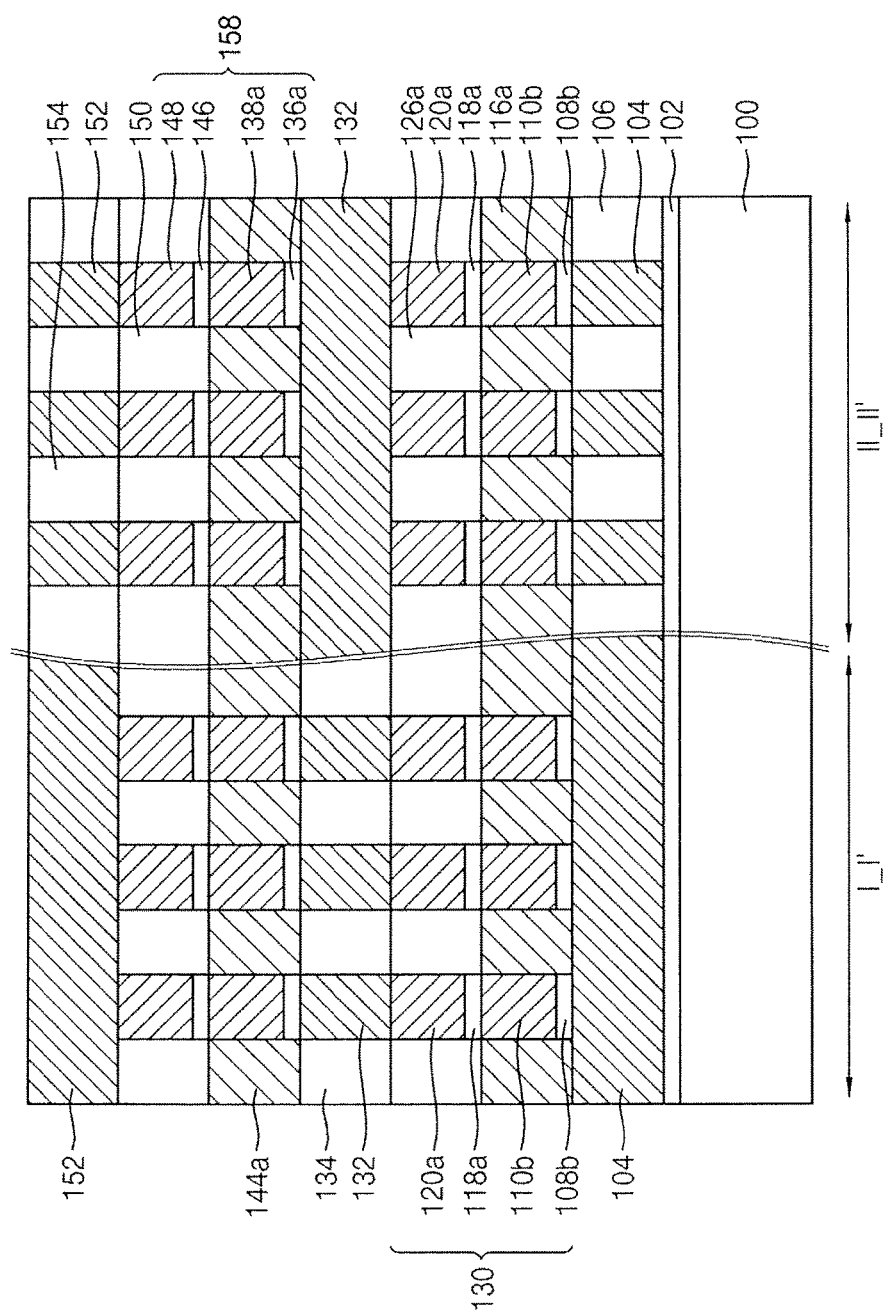
FIG. 32 is a cross-sectional view illustrating a memory device in accordance with example embodiments.

FIG. 32 is a cross-sectional view illustrating a memory device in accordance with example embodiments.

The memory device may be substantially the same as or similar to the variable resistance memory device illustrated with reference to FIGS. 1 and 2, except for first and second barrier insulation patterns and the first and second cell structures.

Referring to FIG. 32, the memory device may be formed on the substrate 100. The memory device include the first conductive pattern 104, the first cell structure 130, a first barrier insulation pattern 116a, the second conductive pattern 132, the second cell structure 158, a second barrier insulation pattern 144a and the third conductive pattern 152. The first cell structure 130 may include the first lower electrode 108b, the first selection pattern 110b, the first electrode 118a and the first variable resistance pattern 120a sequentially stacked. The second cell structure 158 may include the second selection pattern 138a, the second electrode 146 and the second variable resistance pattern 148 sequentially stacked.

The first conductive pattern 104 may extend in the first direction.

In example embodiments, the first conductive pattern 104 may serve as a first word line in the memory device. In example embodiments, the first conductive pattern 104 may serve as a first bit line of the variable resistance memory device.

The first cell structure 130 may have a pillar shape. The first cell structure 130 may be formed on the first conductive pattern 104, and a plurality of first cell structures 130 may be spaced apart from each other on each of the first conductive patterns 104. The first cell structures 130 may be aligned with each other in each of the first and second directions.

In example embodiments, the first selection pattern 110b may include an OTS material.

In example embodiments, a conductivity type of the first selection pattern 110b may be a p type or a p− type. In example embodiments, a conductivity type of the first selection pattern 110b may be an n type.

In example embodiments, the first lower electrode 108b may be further formed between the first selection pattern 110b and the first conductive pattern 104. Also, a first upper electrode (not shown) may be further formed on the first variable resistance pattern 120a.

The first barrier insulation pattern 116a may be formed to fill a space between the first selection patterns 110b. Thus, the first barrier insulation pattern 116a may directly contact a sidewall of the first selection pattern 110b.

The first barrier insulation pattern 116a may include a material having a negative charge. In example embodiments, the first barrier insulation pattern 116a may include a material doped with dopants having a negative charge. For example, the first barrier insulation pattern 116a may include silicon oxide doped with fluorine or boron.

The material doped with dopants having a negative charge may be formed on the sidewall of the first selection pattern 110b, so that currents may hardly flow at the sidewall of the first selection pattern 110b. Thus, the currents may flow at the central portion of the first selection pattern 110b, so that a current path may be formed at the central portion of the first selection pattern 110b. Also, leakage currents from the sidewall of the first selection pattern 110b may decrease.

The first variable resistance pattern 120a may be formed on the first electrode 118a.

The second conductive pattern 132 may extend in the second direction.

The first and second conductive patterns 104 and 132 may cross each other. The first cell structure 130 may be formed at each cross-point of the first and second conductive patterns 104 and 132.

Insulation patterns may be formed to fill a space between the first conductive patterns 104, a space between the first variable resistance patterns 120a, and a space between the second conductive patterns 132.

In example embodiments, the first insulation pattern 106 may be formed between the first conductive patterns 104. The third insulation pattern 126a may be formed between the first variable resistance patterns 120a. The fourth insulation pattern 134 may be formed between the second conductive patterns 132. The first barrier insulation pattern 116a may be formed between the first selection patterns 110b.

In example embodiments, the first, third and fourth insulation patterns 106, 126a and 134 may include substantially the same material. In example embodiments, at least one of the first, third and fourth insulation patterns 106, 126a and 134 may include a material different from that of the others.

In example embodiments, the first, third and fourth insulation patterns 106, 126a and 134 may include a material different from a material of the first barrier insulation pattern 116a. For example, the first, third and fourth insulation patterns 106, 126a and 134 may include silicon nitride, and the first barrier insulation pattern 116a may include silicon oxide doped with fluorine or boron.

The second cell structure 158 may be formed on the second conductive pattern 132. The second cell structure 158 may be substantially the same as the first cell structure 130.

The second barrier insulation pattern 144a may fill a space between the second selection patterns 138a. Thus, the second barrier insulation pattern 144a may directly contact a sidewall of the second selection pattern 138a.

The second barrier insulation pattern 144a may include a material having a negative charge. The second barrier insulation pattern 144a may include a material doped with a dopant having a negative charge. For example, the second barrier insulation pattern 144a may include silicon oxide doped with fluorine or boron.

The second variable resistance pattern 148 may be formed on the second electrode 146.

The third conductive pattern 152 may extend in the first direction.

The second and third conductive patterns 132 and 152 may cross each other, and the second cell structure 158 may be formed at a cross-point of the second and third conductive patterns 132 and 152.

Insulation patterns may be formed to fill a space between the second variable resistance patterns 148 and a space between the third conductive patterns 152.

In example embodiments, the sixth insulation pattern 150 may be formed between the second variable resistance patterns 148, and the seventh insulation pattern 154 may be formed between the third conductive patterns 152. The second barrier insulation pattern 144a may be formed between the second selection patterns 138a.

In example embodiments, the sixth and seventh insulation patterns 150 and 154 may include substantially the same material. In example embodiments, the sixth and seventh insulation patterns 150 and 154 may include different materials.

Figure 33:
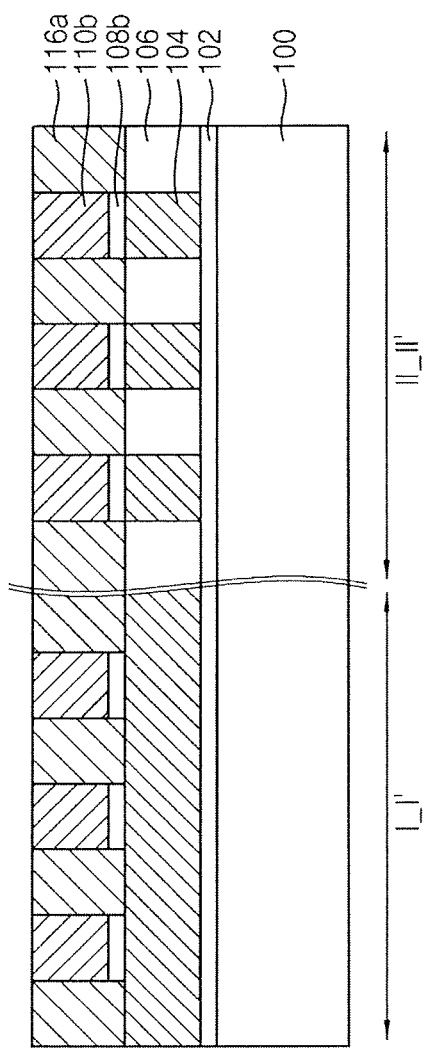
FIGS. 33 to 35 are cross-sectional views illustrating stages of a method of manufacturing the memory device shown in FIG. 32 in accordance with example embodiments.
Figure 34:
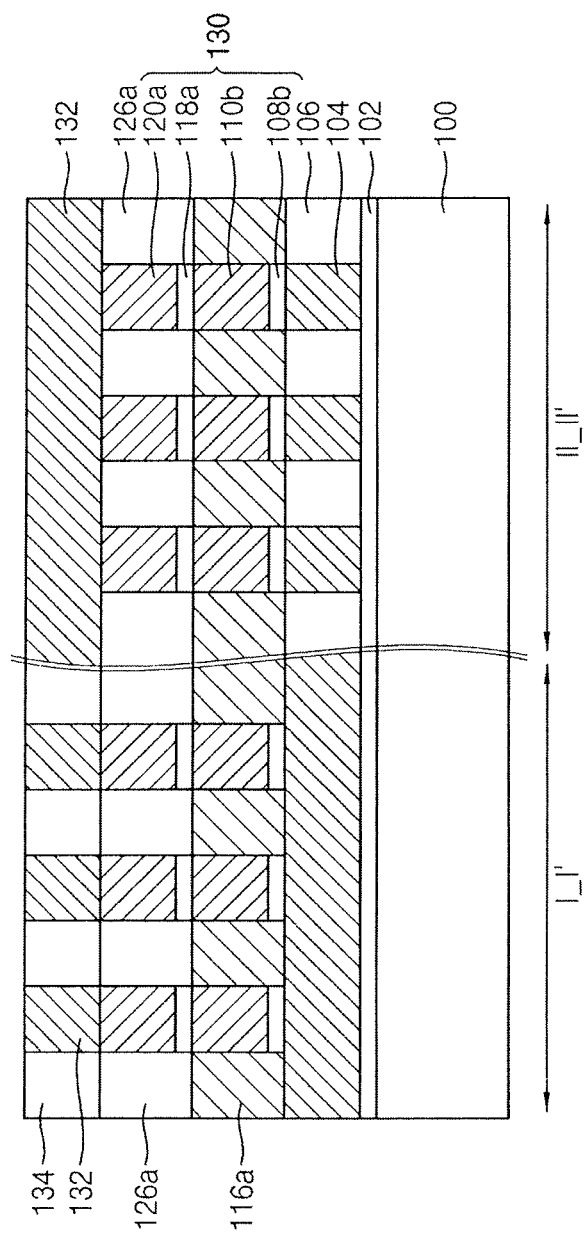
Figure 35:
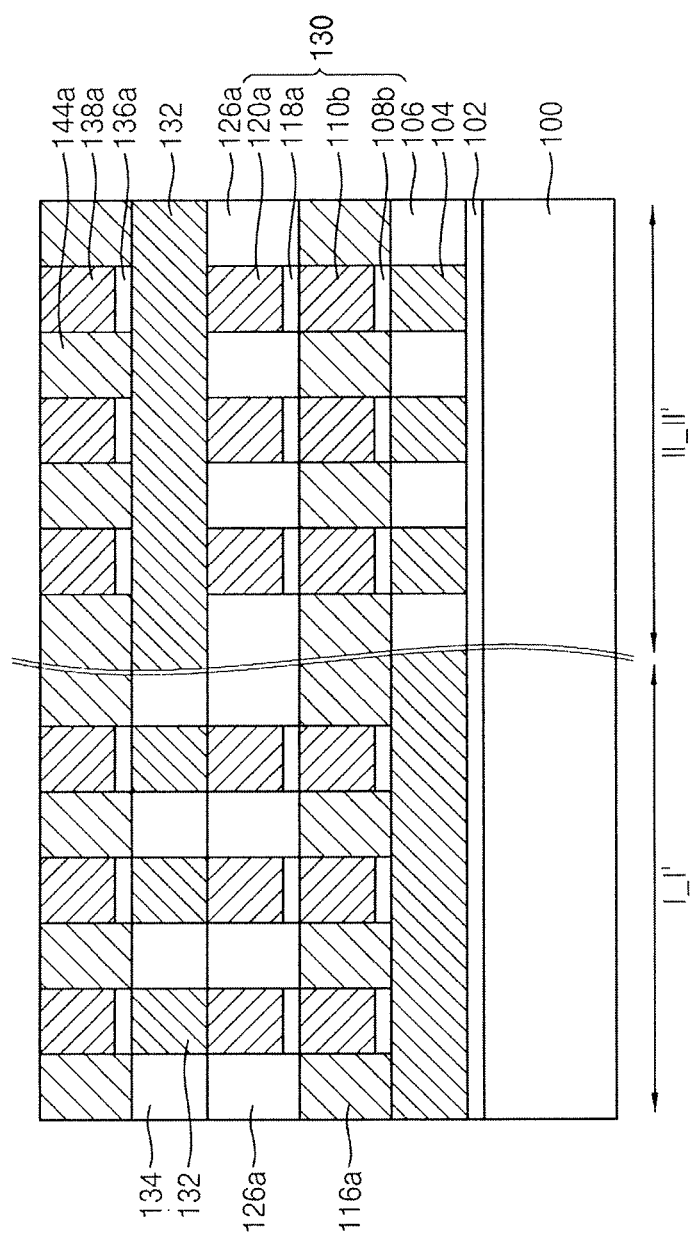

FIGS. 33 to 35 are cross-sectional views illustrating stages of a method of manufacturing the memory device shown in FIG. 32 in accordance with example embodiments.

First, processes illustrated with reference to FIGS. 5 to 9 may be performed.

Referring to FIG. 33, a first barrier insulation pattern 116a may be formed to fill a space between the first selection patterns 110b and a space between the first lower electrodes 108b.

In example embodiments, a first barrier insulation layer having a negative charge may be formed to fill the space between the first selection patterns 110b and the space between the first conductive patterns 104. For example, the first barrier insulation layer may be formed by forming a silicon oxide layer and implanting dopants having a negative charge into the silicon oxide layer. The silicon oxide layer may be formed by, e.g., a chemical vapor deposition (CVD) process, an atomic layer deposition (ALD) process, or, a thermal oxidation process, etc. The dopants may include, e.g., fluorine or boron. The first barrier insulation layer may be planarized until an upper surface of the first hard mask 111a may be exposed, and the first barrier insulation layer may be partially etched to form the first barrier insulation pattern 116a. The first hard mask 111a may be removed by, e.g., a wet etching process. Thus, an upper surface of the first selection pattern 110b may be exposed. Also, upper surfaces of the first selection pattern 110b and the first barrier insulation pattern 116a may be coplanar with each other.

Referring to FIG. 34, the first electrode 118a and the first variable resistance pattern 120a may be formed on the first selection pattern 110b. The third insulation pattern 126a may be formed to fill a space between structures each including the first electrode 118a and the first variable resistance pattern 120a. The second conductive pattern 132 may be formed on the first variable resistance pattern 120a and the third insulation pattern 126a. The fourth insulation pattern 134 may be formed to fill a space between the second conductive patterns 132.

The above processes may be substantially the same as or similar to the processes illustrated with reference to FIGS. 12 to 15.

Referring to FIG. 35, the second lower electrode 136a and the second selection pattern 138a may be formed on the second conductive pattern 132 and the fourth insulation pattern 134. A second barrier insulation pattern 144a may be formed to fill a space between the second selection patterns 138a.

The second lower electrode 136a and the second selection pattern 138a may be formed by performing the processes substantially the same as or similar to the processes illustrated with reference to FIGS. 16 and 17. Processes for forming the second barrier insulation pattern 144a may be substantially the same as or similar to the processes for forming the first barrier insulation pattern 116a.

Referring to FIG. 32 again, the second electrode 146 and the second variable resistance pattern 148 may be formed on the second selection pattern 138a. The sixth insulation pattern 150 may be formed to fill a space between structures each including the second electrode 146 and the second variable resistance pattern 148. The third conductive pattern 152 may be formed on the second variable resistance pattern 148 and the sixth insulation pattern 150. The seventh insulation pattern 154 may be formed to fill a space between the third conductive patterns 152.

Figure 36:
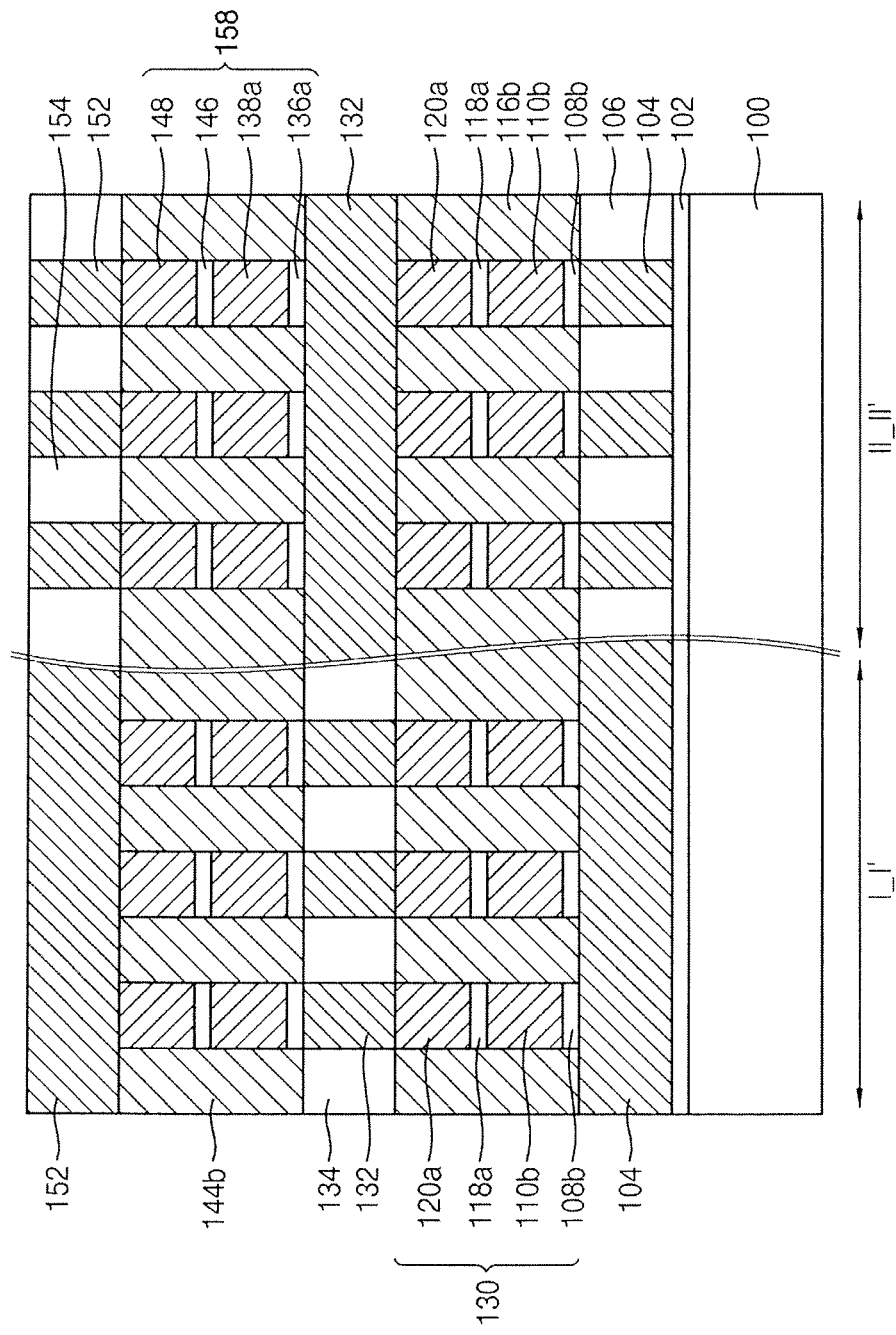
FIG. 36 is a cross-sectional view illustrating a memory device in accordance with example embodiments.

FIG. 36 is a cross-sectional view illustrating a memory device in accordance with example embodiments.

The memory device may be substantially the same as or similar to the memory device illustrated with reference to FIG. 32, except for first and second barrier insulation patterns.

Referring to FIG. 36, the memory device may be formed on the substrate 100. The memory device may include the first conductive pattern 104, the first cell structure 130, a first barrier insulation pattern 116b, the second conductive pattern 132, the second cell structure 158, a second barrier insulation pattern 144b and the third conductive pattern 152. The first cell structure 130 may include the first lower electrode 108b, the first selection pattern 110b, the first electrode 118a and the first variable resistance pattern 120a. The second cell structure 158 may include the second selection pattern 138a, the second electrode 146 and the second variable resistance pattern 148.

The first conductive pattern 104 may extend in the first direction.

The first cell structure 130 may have a pillar shape. The first cell structure 130 may be formed on the first conductive pattern 104, and a plurality of first cell structures 130 may be spaced apart from each other on each of the first conductive pattern 104. The first cell structures 130 may be aligned with each other in each of the first and second directions.

The first barrier insulation pattern 116b may be formed to fill a space between the first cell structures 130. For example, the first barrier insulation pattern 116b may directly contact sidewalls of the first selection pattern 110b, the first electrode 118a and the first variable resistance pattern 120a.

The first barrier insulation pattern 116b may include a material having a negative charge. The first barrier insulation pattern 116b may include a material doped with a dopant having a negative charge. For example, the first barrier insulation pattern 116b may include silicon oxide doped with fluorine or boron. Thus, leakage currents from the sidewall of the first selection pattern 110b may decrease.

The second conductive pattern 132 may be formed on the first variable resistance pattern 120a and the first barrier insulation pattern 116b, and may extend in the second direction.

Thus, the first and second conductive patterns 104 and 132 may be disposed to cross each other. The first cell structure 130 may be formed at each cross-point of the first and second conductive patterns 104 and 132.

The first insulation pattern 106 may be formed between the first conductive patterns 104. The fourth insulation pattern 134 may be formed between the second conductive patterns 132. In example embodiments, each of the first and fourth insulation patterns 106 and 134 may include a material different from a material of the first barrier insulation pattern 116b. For example, the first and fourth insulation patterns 106 and 134 may include silicon nitride and the first barrier insulation pattern 116b may include silicon oxide doped with fluorine or boron.

The second cell structure 158 may be formed on the second conductive pattern 132. The second cell structure 158 may be substantially the same as the first cell structure 130.

The second barrier insulation pattern 144b may fill a space between the second cell structures 158. For example, the second barrier insulation pattern 144b may directly contact sidewalls of the second selection pattern 138a, the second electrode 146 and the second variable resistance pattern 148.

The second barrier insulation pattern 144b may include a material substantially the same as a material of the first barrier insulation pattern 116b.

The third conductive pattern 152 may extend in the first direction.

Thus, the second and third conductive patterns 132 and 152 may cross each other. The second cell structure 158 may be formed at each cross-point of the second and third conductive patterns 132 and 152.

The seventh insulation pattern 154 may be formed between the third conductive patterns 152. In example embodiments, the seventh insulation pattern 154 may include a material different from a material of the second barrier insulation pattern 144b. For example, the seventh insulation pattern 154 may include silicon nitride and the second barrier insulation pattern 144b may include silicon oxide doped with fluorine or boron.

FIGS. 37 to 40 are cross-sectional views illustrating stages of a method of manufacturing the memory device shown in FIG. 36 in accordance with example embodiments.

First, the first conductive pattern 104 and the first insulation pattern 106 may be formed on the substrate 100 by performing processes substantially the same as or similar to the processes illustrated with reference to FIG. 5.

Figure 37:
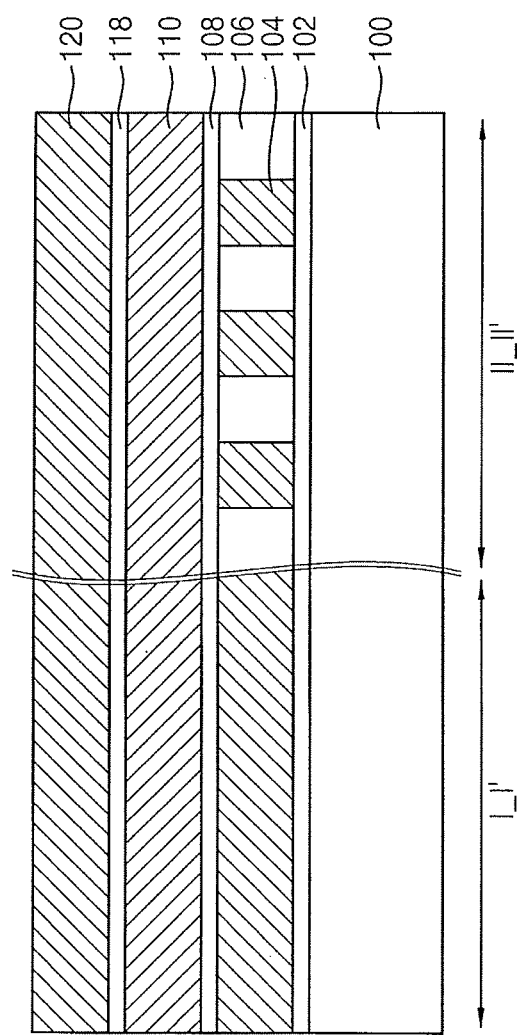
FIGS. 37 to 40 are cross-sectional views illustrating stages of a method of manufacturing the memory device shown in FIG. 36 in accordance with example embodiments.

Referring to FIG. 37, the first lower electrode layer 108, the first selection layer 110, the first electrode layer 118 and the first variable resistance layer 120 may be sequentially formed on the first conductive pattern 104 and the first insulation pattern 106.

Figure 38:
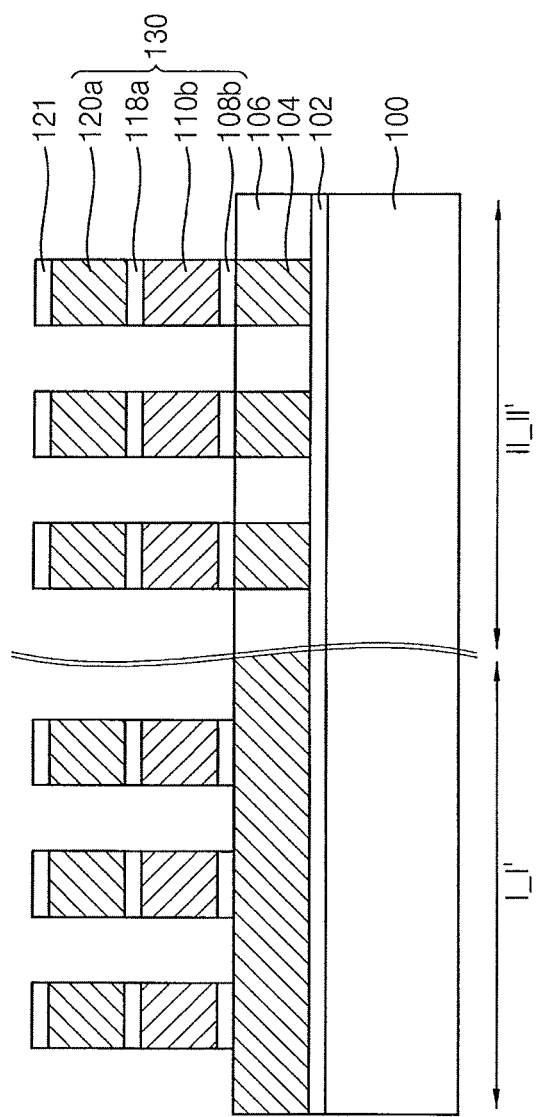

Referring to FIG. 38, the first lower electrode layer 108, the first selection layer 110, the first electrode layer 118 and the first variable resistance layer 120 may be patterned to form the first cell structure 130 including the first lower electrode 108b, the first selection pattern 110b, the first electrode 118a and the first variable resistance pattern 120a sequentially stacked. The first cell structure 130 may have a pillar shape.

In example embodiments, the first lower electrode layer 108, the first selection layer 110, the first electrode layer 118 and the first variable resistance layer 120 may be etched using a preliminary first hard mask extending in the first direction as an etching mask. The first lower electrode layer 108, the first selection layer 110, the first electrode layer 118 and the first variable resistance layer 120 may be etched again using a second hard mask extending in the second direction as an etching mask to form the first cell structure 130 and a first hard mask 121. The second hard mask may be removed.

In example embodiments, a hard mask having a pillar shape may be formed on the first variable resistance layer 120, and the first lower electrode layer 108, the first selection layer 110, the first electrode layer 118 and the first variable resistance layer 120 may be etched using the hard mask to form the first cell structure 130.

Figure 39:
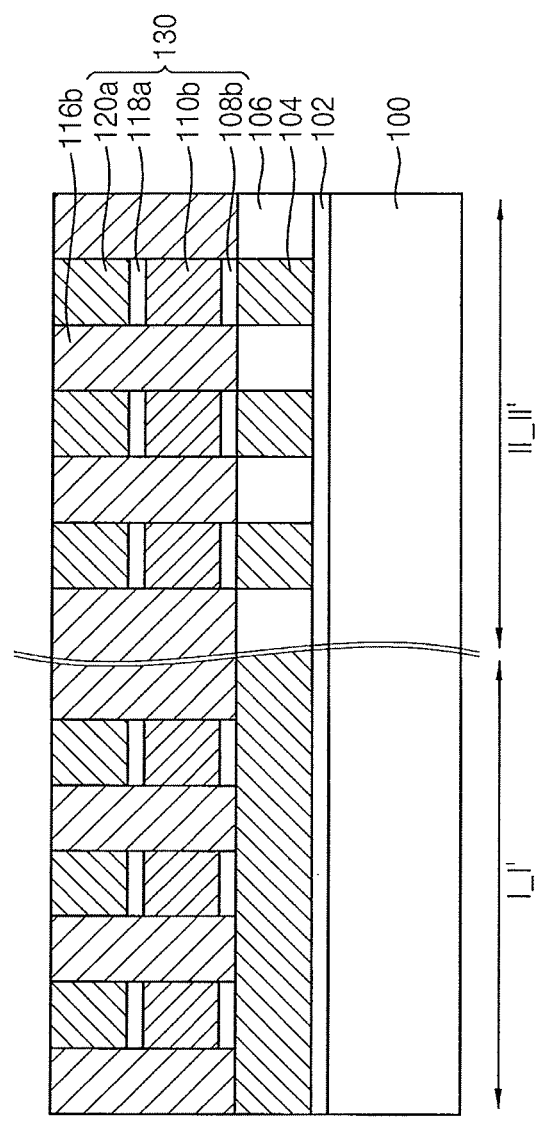

Referring to FIG. 39, a first barrier insulation pattern 116b may be formed to fill a space between the first cell structures 130.

In example embodiments, a first barrier insulation layer having a negative charge may be formed to fill the space between the first cell structures 130. For example, the first barrier insulation layer may be formed by forming a silicon oxide layer and implanting dopants having a negative charge into the silicon oxide layer. The dopants may include, e.g., fluorine, boron, etc.

The first barrier insulation layer may be planarized until an upper surface of the first hard mask 121 may be exposed, and the first barrier insulation layer may be partially etched to form the first barrier insulation pattern 116b. The first hard mask 121 may be removed by, e.g., a wet etching process. Thus, an upper surface of the first variable resistance pattern 120a may be exposed, and upper surfaces of the first variable resistance pattern 120a and the first barrier insulation pattern 116b may be coplanar with each other.

Figure 40:
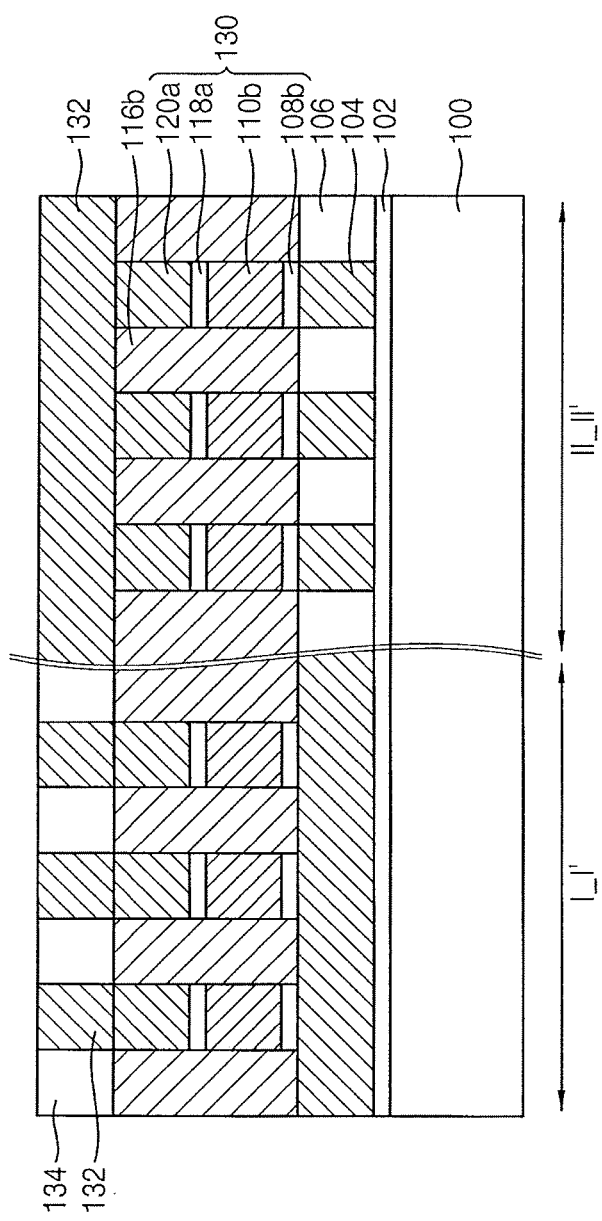

Referring to FIG. 40, the second conductive pattern 132 may be formed on the first cell structure 130 and the first barrier insulation pattern 116b. The fourth insulation pattern 134 may be formed to fill space between the second conductive patterns 132.

Referring to FIG. 36 again, the second cell structure 158 and the second barrier insulation pattern 144b may be formed on the second conductive pattern 132 and the fourth insulation pattern 134. The second cell structure 158 may be substantially the same as the first cell structure 130, and the second barrier insulation pattern 144b may be substantially the same as the first barrier insulation pattern 116b. Thus, the second cell structure 158 and the second barrier insulation pattern 144b may be formed by performing processes substantially the same as or similar to the processes illustrated with reference to FIGS. 37 to 39.

The third conductive pattern 152 may be formed on the second cell structure 158 and the second variable resistance pattern 148. The seventh insulation pattern 154 may be formed to fill a space between the third conductive patterns 152.

Figure 41:
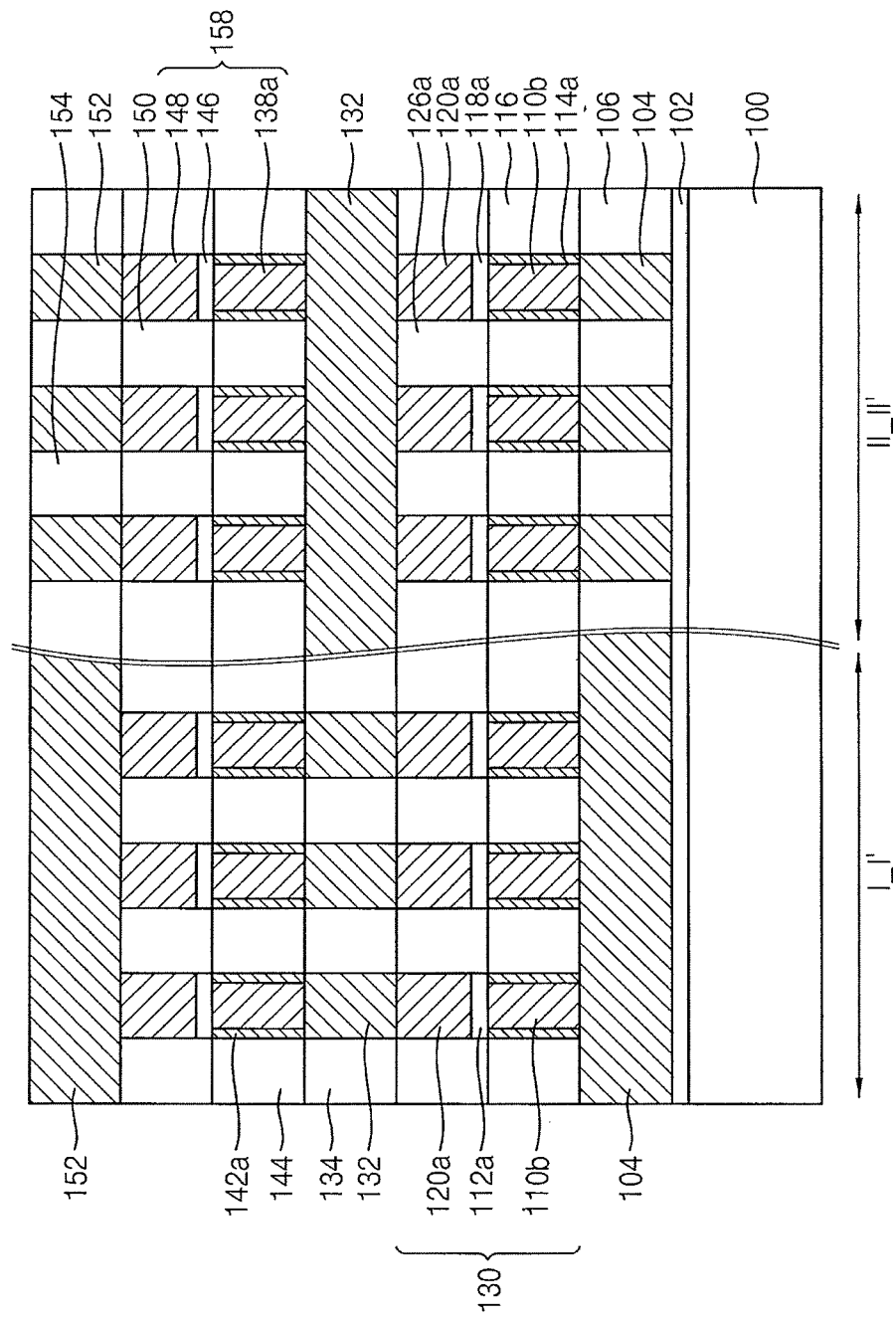
FIG. 41 is a cross-sectional view illustrating a memory device in accordance with example embodiments.

FIG. 41 is a cross-sectional view illustrating a memory device in accordance with example embodiments.

The memory device may be substantially the same as or similar to the memory device illustrated with reference to FIGS. 1 and 2, except for first and second barrier insulation patterns.

Referring to FIG. 41, the memory device may be formed on the substrate 100. The memory device may include the first conductive pattern 104, the first cell structure 130, a first barrier portion 114a, the second conductive pattern 132, the second cell structure 158, a second barrier portion 142a and the third conductive pattern 152.

The first insulation pattern 106 may be formed between the first conductive patterns 104. The second and third insulation patterns 116 and 126a may be formed between the first cell structures 130.

In example embodiments, the first barrier portion 114a may be an insulation pattern having a negative charge, and may be formed on the sidewall of the second insulation pattern 116. The insulation pattern may include an insulation material doped with dopants having a negative charge. The insulation pattern or the first barrier portion 114 may be a spacer on the sidewall of the of the second insulation pattern 116.

As the first barrier portion 114a is formed, currents may flow at the central portion of the first selection pattern 110b, and thus a main current path may be formed at the central portion of the first selection pattern 110b. Also, the currents may hardly flow at the sidewall of the first selection pattern 110b, so that leakage currents from the sidewall of the first selection pattern 110b may decrease.

The second conductive pattern 132 may be formed on the first variable resistance pattern 120a, and may extend in the second direction.

Thus, the first and second conductive patterns 104 and 132 may cross each other. The first cell structure 130 may be formed at each cross-point of the first and second conductive patterns 104 and 132.

Insulation patterns may fill a space between the first conductive patterns 104, a space between the first cell structures 130, and a space between the second conductive patterns 132.

The second cell structure 158 and the second barrier portion 142a may be formed on the second conductive pattern 132. The second cell structure 158 may be substantially the same as the first cell structure 130, and the second barrier portion 142a may be substantially the same as the first barrier portion 114a.

The fifth and sixth insulation patterns 144 and 150 may be formed between the second cell structures 158.

The third conductive pattern 152 may be formed on the second cell structure 158 and the sixth insulation pattern 150, and may extend in the first direction. The seventh insulation pattern 154 may be formed between the third conductive patterns 152.

Figure 41A:
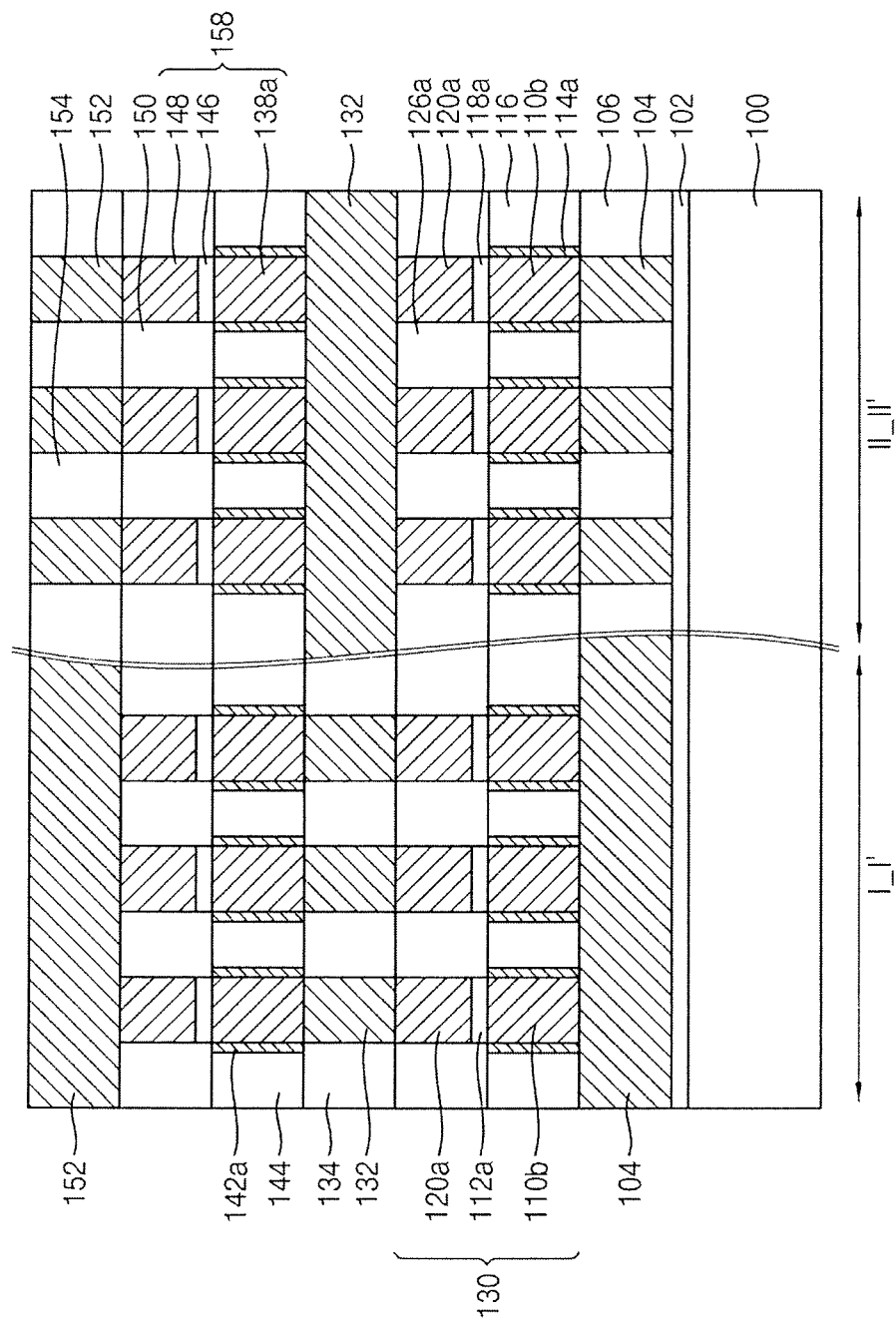
FIG. 41A is a cross-sectional view illustrating a memory device in accordance with example embodiments.

In example embodiments as shown in FIG. 41A, the first barrier portion 114a may be formed between the second insulation pattern 116 and the first selection pattern 110b. The first barrier portion 114a may surround the first selection pattern 110b.

In example embodiments, the first barrier portion 114a may be a p type doped region adjacent to a sidewall of the second insulation pattern 116.

FIGS. 42 to 45 are cross-sectional views illustrating stages of a method of manufacturing the memory device shown in FIG. 41 in accordance with example embodiments.

First, processes illustrated with reference to FIG. 5 may be performed to form the first conductive pattern 104 and the first insulation pattern 106 on the substrate 100.

Figure 42:
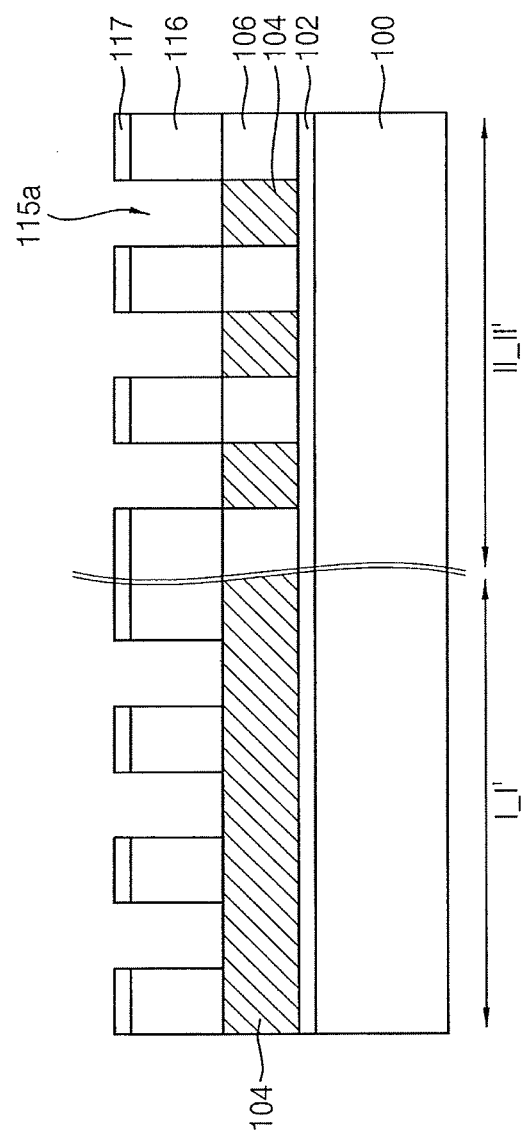
FIGS. 42 to 45 are cross-sectional views illustrating stages of a method of manufacturing the memory device shown in FIG. 41 in accordance with example embodiments.

Referring to FIG. 42, a second insulation layer may be formed on the first conductive pattern 104 and the first insulation pattern 106. A first hard mask 117 may be formed on the second insulation layer. The second insulation layer may be etched using the first hard mask 117 as an etching mask to form a second insulation pattern 116 including openings 115a.

Each of the openings 115a may define a space for a portion of the first selection pattern 110b of FIG. 41. An upper surface the first conductive pattern 104 may be exposed by each of the openings 115a.

Figure 43:
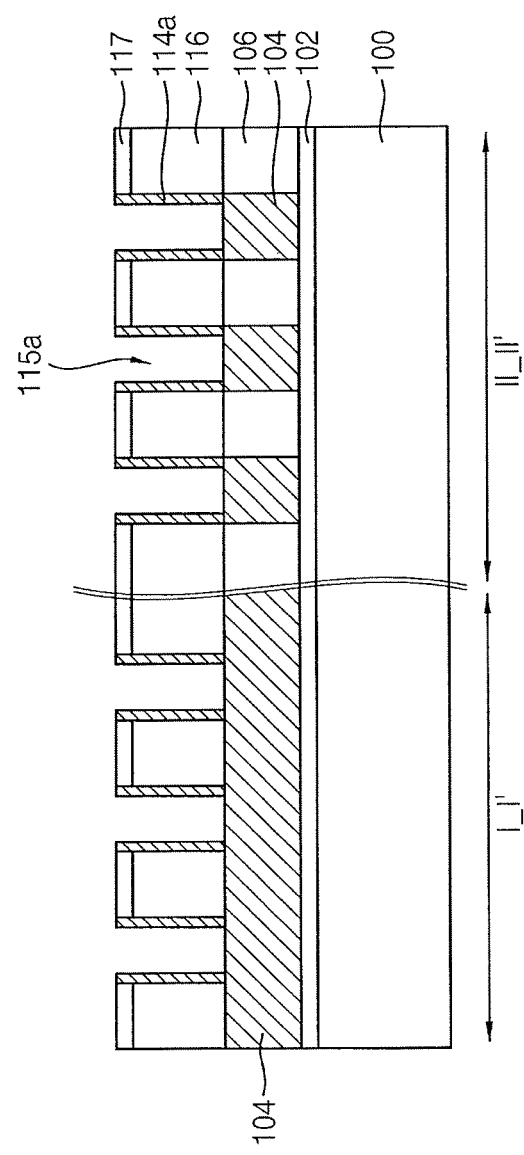

Referring to FIG. 43, a first barrier portion 114a may be formed at a sidewall of each of the openings 115a.

In example embodiments, the first barrier portion 114a may be an insulation pattern having a negative charge. In this case, a first barrier insulation layer having a negative charge may be formed on the first insulation pattern 106, the first hard mask 117 and the first conductive pattern 104. For example, the first barrier insulation layer may be formed by forming a silicon oxide layer and implanting dopants having a negative charge into the silicon oxide layer. The first barrier insulation layer may be anisotropically etched until an upper surface of first conductive pattern 104 may be exposed to form the insulation pattern serving as the first barrier portion 114a.

Figure 43A:
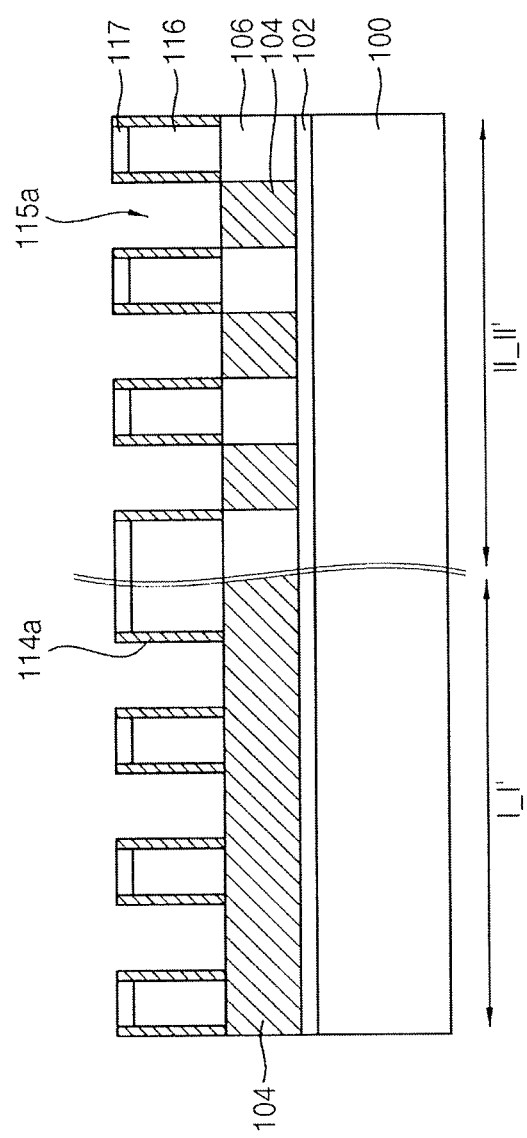
FIG. 43A is a cross-section view illustrating a stage corresponding to a stage of FIG. 43 in accordance with example embodiments.

In example embodiments as shown in FIG. 43A, the first barrier portion 114a may be a p type doped region. In this case, p type impurities may be doped into the sidewall of the opening 115a to form the first barrier portion 114a. In example embodiments, doping the p type impurities may be performed by a plasma doping process or an ion implantation process. The p type impurities may be implanted into the substrate 100 at a predetermined angle with respect to the top surface of the substrate 100. In this case, the memory device of FIG. 41A may be manufactured.

Figure 44:
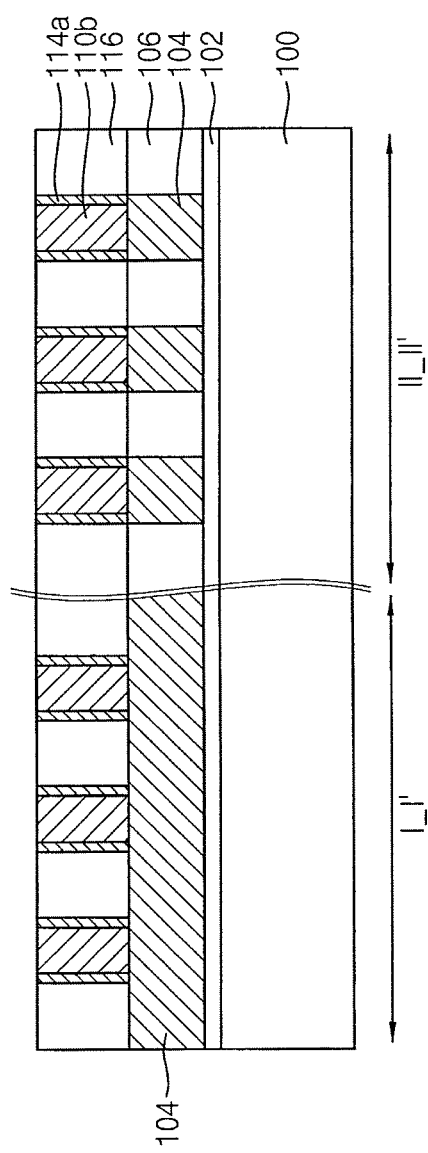

Referring to FIG. 44, a first selection layer may be formed to fill the opening 115a, and the first selection layer may be planarized until an upper surface of the second insulation pattern 116 may be exposed to form the first selection pattern 110b. For example, the first selection pattern 110b may be formed by a damascene process.

Figure 45:
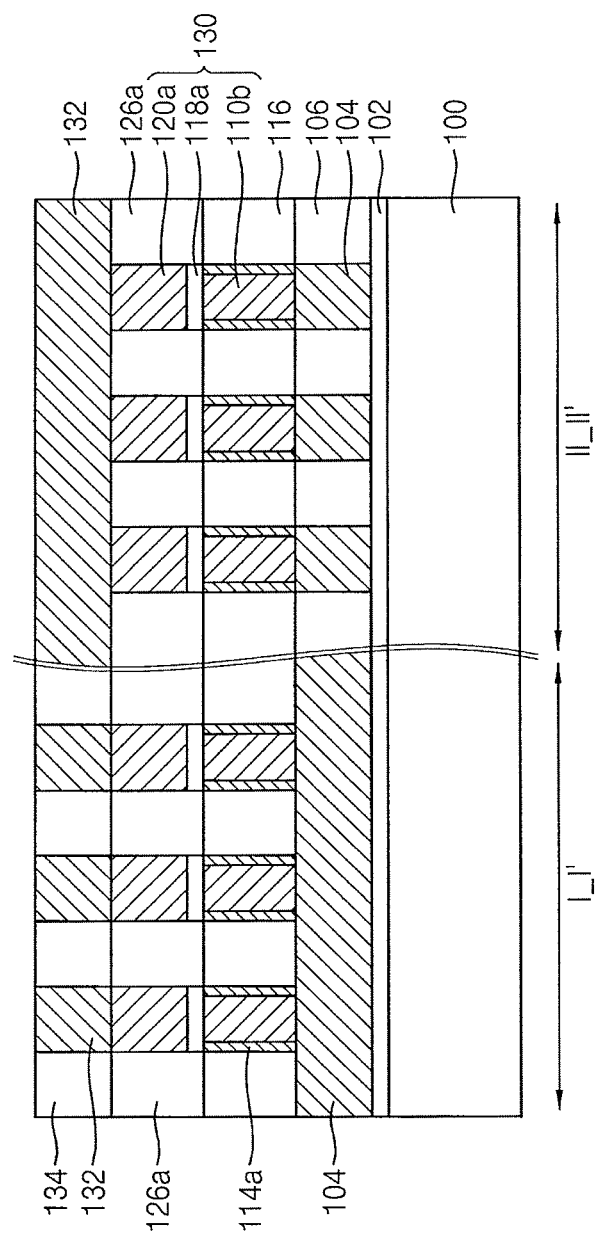

Referring to FIG. 45, the first electrode 118a and the first variable resistance pattern 120a may be formed on the first selection pattern 110b and the first barrier portion 114a. The third insulation pattern 126a may be formed to fill a space between the first variable resistance patterns 120a.

Thus, the first cell structure 130 having the first barrier portion 114a may be formed on the first conductive pattern 104.

The second conductive pattern 132 may be formed on the third insulation pattern 126a and the first variable resistance pattern 120a. A fourth insulation pattern 134 may be formed to fill a space between the second conductive patterns 132.

The above processes may be substantially the same as or similar to the processes illustrated with reference to FIGS. 12 to 16.

Referring to FIG. 41 again, the fifth insulation pattern 144, the second cell structure 158, a second barrier portion 142a and the sixth insulation pattern 150 may be formed on the second conductive pattern 132 and the fourth insulation pattern 134. The above processes may be substantially the same as or similar to the processes illustrated with reference to FIGS. 42 to 45.

The third conductive pattern 152 may be formed on the sixth insulation pattern 150 and the second cell structure 158, and the seventh insulation pattern 154 may be formed to fill a space between the third conductive patterns 152.

As described above, the memory device may have stacked cross-point array structures, and leakage currents of the memory device may decrease.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A memory device, comprising;
a plurality of first conductive patterns on a substrate, each of the plurality of first conductive patterns extending in a first direction;
a first selection pattern on each of the plurality of first conductive patterns;
a first barrier portion surrounding the first selection pattern;
a first electrode and a first variable resistance pattern on the first selection pattern; and
a plurality of second conductive patterns on the first variable resistance pattern, each of the plurality of second conductive patterns extending in a second direction crossing the first direction,
wherein the first selection pattern has a conductivity of an n type or a p type, and wherein the first barrier portion is a p type doped region adjacent to a sidewall of the first selection pattern.

2. The memory device of claim 1,
wherein a potential well is formed at a central portion of the first selection pattern by a contact between the first barrier portion and the first selection pattern.

3. The memory device of claim 1,
wherein the first selection pattern has a conductivity of a p type, and
wherein a doping concentration of the p type doped region of the first barrier portion is greater than a doping concentration of the first selection pattern.

4. The memory device of claim 1,
wherein the first selection pattern includes an OTS material including germanium (Ge), silicon (Si), arsenic (As) and/or tellurium (Te).

5. The memory device of claim 1, further comprising:
a second selection pattern on each of the plurality of second conductive patterns;
a second barrier portion surrounding the second selection pattern;
a second electrode and a second variable resistance pattern on the second selection pattern; and
a plurality of third conductive patterns on the second variable resistance pattern, each of the plurality of second conductive patterns extending in the first direction.

6. A memory device, comprising:
a plurality of first conductive patterns on a substrate, each of the plurality of first conductive patterns extending in a first direction;
a first cell structure on the first conductive pattern, and the first cell structure including a first selection pattern, a first electrode and a first variable resistance pattern sequentially stacked;
a first barrier portion surrounding the first selection pattern;
a plurality of second conductive patterns on the first cell structure, each of the plurality of second conductive patterns extending in a second direction crossing the first direction;
a second cell structure on the second conductive pattern, the second cell structure including a second selection pattern, a second electrode and a second variable resistance pattern sequentially stacked;
a second barrier portion surrounding the second selection pattern; and
a plurality of third conductive patterns on the second cell structure, each of the plurality of third conductive patterns extending in the first direction,
wherein the first selection pattern has a conductivity of an n type or a p type,
wherein the first barrier portion is a p typed doped region adjacent to a sidewall of the first selection pattern, and
wherein the second barrier portion is a p type doped region adjacent to a sidewall of the second selection pattern.

7. The memory device of claim 6,
wherein a potential well is formed at a central portion of the first selection pattern by a contact between the first barrier portion and the first selection pattern.

8. A memory device, comprising:
a first conductive pattern having a first width on a substrate,
wherein the first conductive pattern extends in a first direction;
a first selection pattern having a second width on the first conductive pattern,
wherein the second width is smaller than the first width;
a first barrier portion surrounding the first selection pattern;
a first electrode on the first selection pattern and the first barrier portion;
a first variable resistance pattern on the first electrode; and
a second conductive pattern on the first variable resistance pattern,
wherein the second conductive pattern extends in a second direction crossing the first direction, and wherein the first selection pattern has a conductivity of an n type or a p type, and wherein the first barrier portion is a p type doped region adjacent to a sidewall of the first selection pattern.

9. The memory device of claim 8,
wherein a combined structure of the first barrier portion and the first selection pattern has a third width which is substantially equal to the first width.

10. The memory device of claim 8,
wherein a width of the first electrode is substantially equal to the first width of the first conductive pattern.

11. The memory device of claim 8,
wherein a width of the first variable resistance pattern is substantially equal to the first width of the first conductive pattern.

12. The memory device of claim 8,
wherein the first barrier portion is in contact with a bottom surface of the first electrode and a top surface of the first conductive pattern.

* * * * *